(12) United States Patent
Chen et al.

(10) Patent No.: US 9,754,928 B2
(45) Date of Patent: Sep. 5, 2017

(54) SMD, IPD, AND/OR WIRE MOUNT IN A PACKAGE

(71) Applicant: Taiwan Semiconductor Manufacturing Company, Ltd., Hsin-Chu (TW)

(72) Inventors: Hsien-Wei Chen, Hsin-Chu (TW); Ming-Yen Chiu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/737,210

(22) Filed: Jun. 11, 2015

(65) Prior Publication Data

US 2016/0021754 A1 Jan. 21, 2016

Related U.S. Application Data

(63) Continuation-in-part of application No. 14/334,217, filed on Jul. 17, 2014, now Pat. No. 9,613,910.

(Continued)

(51) Int. Cl.
*H01L 23/48* (2006.01)
*H01L 23/52* (2006.01)
(Continued)

(52) U.S. Cl.
CPC .......... *H01L 25/50* (2013.01); *H01L 21/6835* (2013.01); *H01L 23/16* (2013.01); *H01L 23/3128* (2013.01); *H01L 23/49811* (2013.01); *H01L 23/49822* (2013.01); *H01L 23/5382* (2013.01); *H01L 23/5383* (2013.01); *H01L 23/5385* (2013.01); *H01L 23/5389* (2013.01); *H01L 23/62* (2013.01); *H01L 24/19* (2013.01); *H01L 24/20* (2013.01); *H01L 24/97* (2013.01); *H01L 25/105* (2013.01); *H01L 25/16* (2013.01);
(Continued)

(58) Field of Classification Search
CPC ................. H01L 21/486; H01L 21/563; H01L 23/49827; H01L 21/561; H01L 21/76898
USPC ................. 438/433, 127, 618; 257/621, 692, 257/E21.502, E23.011
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |

(Continued)

FOREIGN PATENT DOCUMENTS

| | | |
|---|---|---|
| KR | 20070100355 A | 10/2007 |
| WO | 2006043388 A1 | 4/2006 |

*Primary Examiner* — Kimberley Rizkallah
*Assistant Examiner* — Brian Turner
(74) *Attorney, Agent, or Firm* — Slater Matsil, LLP

(57) ABSTRACT

Various package structures and methods of forming package structures are described. According an embodiment, a structure includes a first package and a package component attached to the first package by external connectors. The first package comprises a device attached to a first pad and a second pad. The device is a surface mount device (SMD), an integrated passive device (IPD), or a combination thereof. The device is attached to the first pad and the second pad through a dielectric layer. A spacer material is disposed laterally between the first pad and the second pad and is disposed between the device and the dielectric layer. An encapsulant surrounds the device and the spacer material.

19 Claims, 52 Drawing Sheets

Related U.S. Application Data

(60) Provisional application No. 62/132,643, filed on Mar. 13, 2015.

(51) Int. Cl.

| | | |
|---|---|---|
| *H01L 23/525* | (2006.01) | |
| *H01L 23/538* | (2006.01) | |
| *H01L 21/56* | (2006.01) | |
| *H01L 25/00* | (2006.01) | |
| *H01L 23/16* | (2006.01) | |
| *H01L 23/31* | (2006.01) | |
| *H01L 23/498* | (2006.01) | |
| *H01L 25/10* | (2006.01) | |
| *H01L 21/683* | (2006.01) | |
| *H01L 23/62* | (2006.01) | |
| *H01L 25/16* | (2006.01) | |
| *H01L 23/13* | (2006.01) | |
| *H01L 23/00* | (2006.01) | |

(52) U.S. Cl.
CPC ........ *H01L 21/561* (2013.01); *H01L 21/6836* (2013.01); *H01L 23/13* (2013.01); *H01L 23/49816* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 24/83* (2013.01); *H01L 24/92* (2013.01); *H01L 2221/68318* (2013.01); *H01L 2221/68327* (2013.01); *H01L 2221/68359* (2013.01); *H01L 2221/68372* (2013.01); *H01L 2221/68381* (2013.01); *H01L 2224/04105* (2013.01); *H01L 2224/12105* (2013.01); *H01L 2224/16227* (2013.01); *H01L 2224/2919* (2013.01); *H01L 2224/32145* (2013.01); *H01L 2224/32225* (2013.01); *H01L 2224/45124* (2013.01); *H01L 2224/45139* (2013.01); *H01L 2224/45144* (2013.01); *H01L 2224/45147* (2013.01); *H01L 2224/45164* (2013.01); *H01L 2224/45169* (2013.01); *H01L 2224/48091* (2013.01); *H01L 2224/48227* (2013.01); *H01L 2224/73204* (2013.01); *H01L 2224/73265* (2013.01); *H01L 2224/73267* (2013.01); *H01L 2224/83005* (2013.01); *H01L 2224/83191* (2013.01); *H01L 2224/92244* (2013.01); *H01L 2224/94* (2013.01); *H01L 2224/97* (2013.01); *H01L 2225/0651* (2013.01); *H01L 2225/1035* (2013.01); *H01L 2225/1041* (2013.01); *H01L 2225/1058* (2013.01); *H01L 2924/00014* (2013.01); *H01L 2924/14* (2013.01); *H01L 2924/15311* (2013.01); *H01L 2924/181* (2013.01); *H01L 2924/19011* (2013.01); *H01L 2924/19041* (2013.01); *H01L 2924/19043* (2013.01); *H01L 2924/19105* (2013.01); *H01L 2924/19106* (2013.01); *H01L 2924/19107* (2013.01)

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,791,501 | B1 | 7/2014 | Fuentes et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2004/0217441 | A1 | 11/2004 | Lehmann et al. |
| 2007/0262470 | A1 | 11/2007 | Ichiryu et al. |
| 2008/0316714 | A1 | 12/2008 | Eichelberger et al. |
| 2009/0008765 | A1* | 1/2009 | Yamano ............... H01L 21/6835 257/690 |
| 2009/0224391 | A1 | 9/2009 | Lin et al. |
| 2010/0059854 | A1 | 3/2010 | Lin et al. |
| 2010/0140736 | A1* | 6/2010 | Lin ..................... H01L 23/3128 257/528 |
| 2010/0289126 | A1 | 11/2010 | Pagaila et al. |
| 2010/0308443 | A1* | 12/2010 | Suthiwongsunthorn .................. H01L 21/486 257/621 |
| 2010/0320569 | A1 | 12/2010 | Narita |
| 2011/0006412 | A1* | 1/2011 | Choi ................... H01L 21/6835 257/686 |
| 2011/0147748 | A1* | 6/2011 | Baek ..................... G02F 1/1345 257/59 |
| 2011/0291288 | A1 | 12/2011 | Wu et al. |
| 2012/0061858 | A1* | 3/2012 | Park ..................... H01L 21/563 257/787 |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0298101 | A1 | 11/2013 | Chandra |
| 2013/0307140 | A1 | 11/2013 | Huang et al. |
| 2014/0077364 | A1 | 3/2014 | Marimuthu et al. |
| 2014/0084416 | A1 | 3/2014 | Kang |
| 2014/0097535 | A1* | 4/2014 | He ......................... H01L 25/50 257/738 |
| 2014/0203429 | A1 | 7/2014 | Yu et al. |
| 2014/0211441 | A1* | 7/2014 | Tsukizawa ............... H01L 22/34 361/783 |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2014/0291819 | A1* | 10/2014 | Barth ................. H01L 23/53276 257/659 |
| 2014/0313681 | A1 | 10/2014 | Yamano et al. |
| 2015/0062998 | A1 | 3/2015 | Nam |

\* cited by examiner

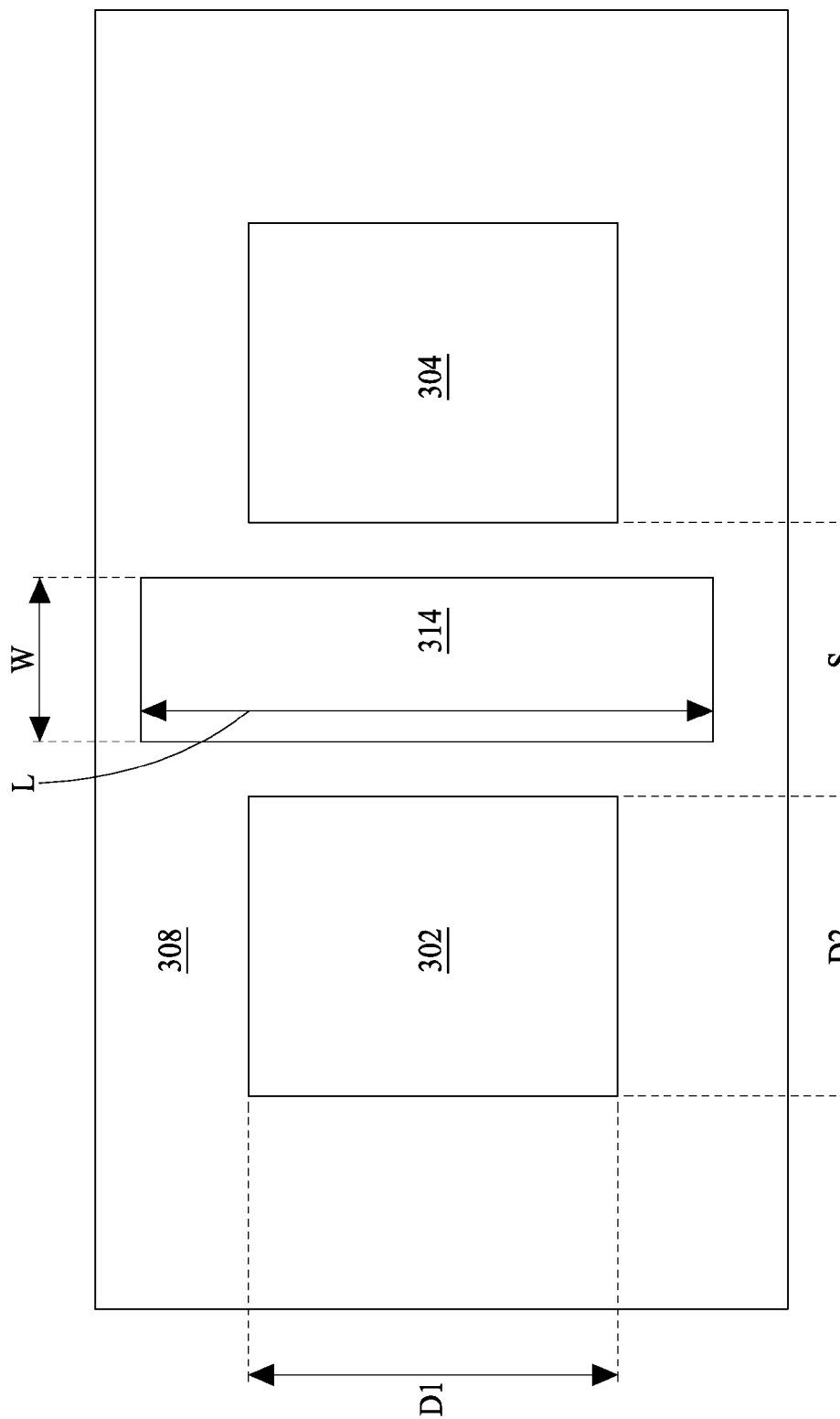

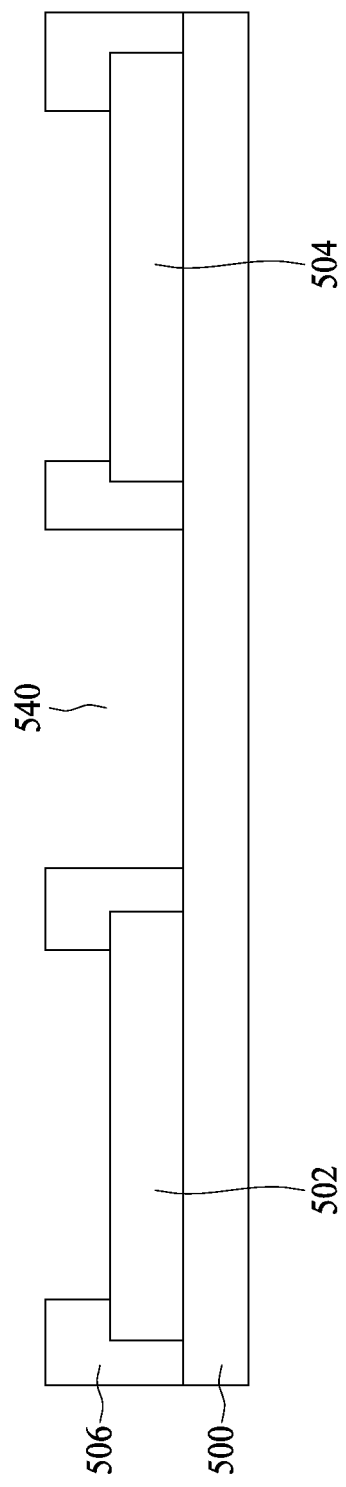

SMD, IPD, AND/OR WIRE MOUNT IN A PACKAGE

This application is a continuation-in-part of U.S. patent application Ser. No. 14/334,217, filed on Jul. 17, 2014, entitled "Anti-Fuse on and/or in Package," which application is hereby incorporated herein by reference in its entirety.

This application claims the benefit of and priority to U.S. Provisional Patent Application No. 62/132,643, filed on Mar. 13, 2015, entitled "SMD, IPD, and/or Wire Mount in a Package," which application is hereby incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are a cross sectional view and a layout view, respectively, of a portion of a package in accordance with some embodiments.

FIGS. 36A through 36C are cross sectional views of intermediate steps during a process for attaching a SMD/IPD in accordance with some embodiments.

DETAILED DESCRIPTION

Figure 1A:
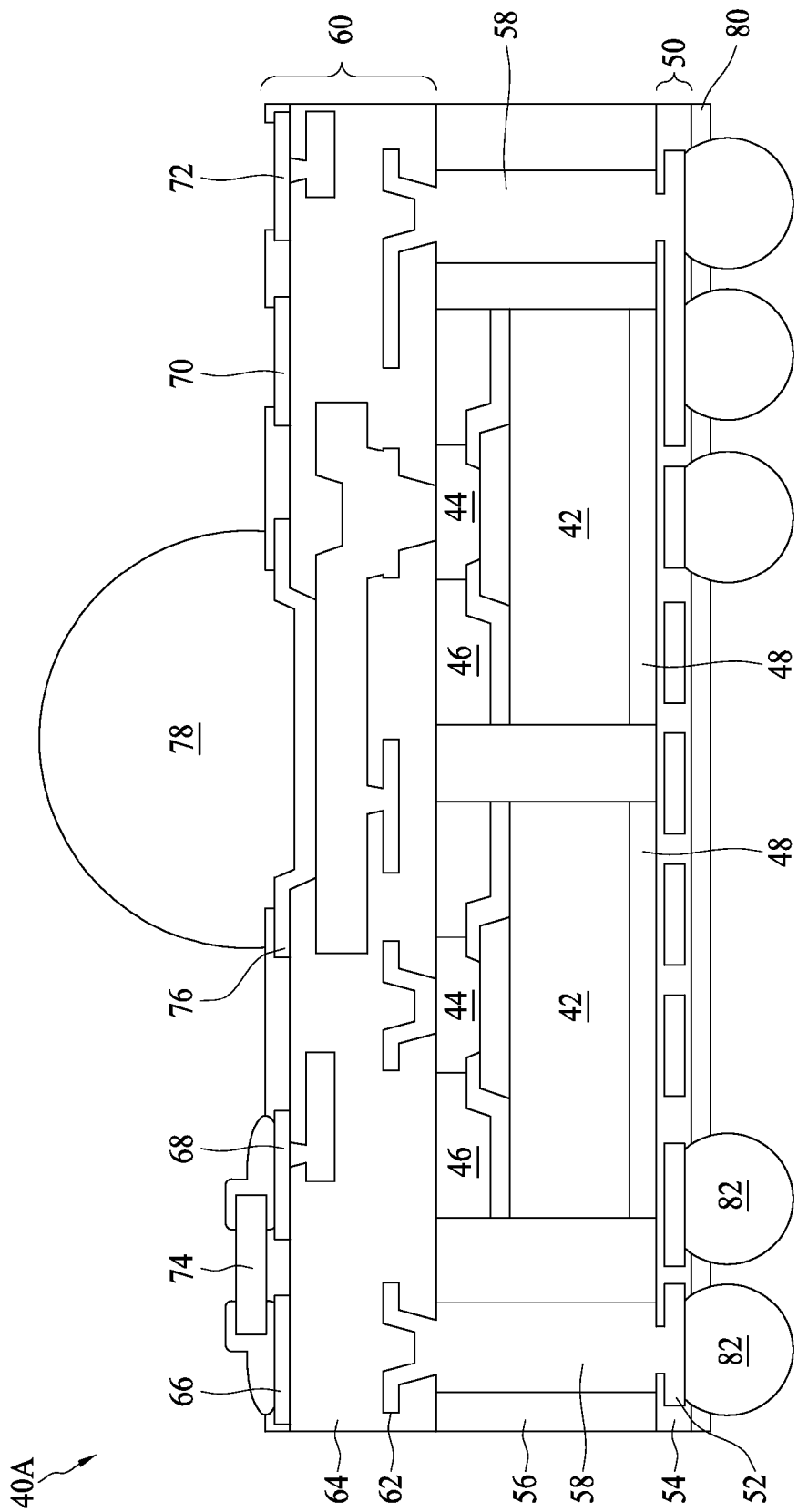
FIG. 1A is a cross sectional view of a package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely attaching a surface mount device (SMD), integrated passive device (IPD), and/or wire, which may function as an anti-fuse, in a fan-out or fan-in wafer-level package. Some embodiments contemplate such a package in a package-on-package (PoP) structure. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIG. 1A illustrates a cross sectional view of a package 40A, such as a fan-out or fan-in wafer-level package, that comprises one or more integrated circuit dies 42 that is programmed by one or more surface mount device (SMD) or integrated passive device (IPD) (hereinafter "SMD/IPD") 74 disposed on or in the package 40A in accordance with some embodiments. The integrated circuit dies 42 each comprise a semiconductor substrate, such as silicon, doped or undoped, or an active layer of a semiconductor-on-insulator (SOI) substrate. The semiconductor substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

Die connectors 44, such as conductive pillars or vias (for example, comprising a metal such as copper), are exterior to the integrated circuit dies 42 and are mechanically and electrically coupled to the respective integrated circuit dies 42 on what may be referred to as respective active sides of the integrated circuit dies 42. The die connectors 44 electrically couple the respective integrated circuits of the integrated circuit dies 42.

A dielectric material 46 is on the active sides of the integrated circuit dies 42. The dielectric material 46 laterally encapsulates the die connectors 44, which have upper surfaces that are co-planar with upper surfaces of the dielectric material 46, and the dielectric material 46 is laterally co-terminus with the respective integrated circuit dies 42. The dielectric material 46 may be a polymer such as polybenzoxazole (PBO), polyimide (PI), benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof.

Adhesive 48 is on back sides of the integrated circuit dies 42 and adheres the integrated circuit dies 42 to a front side redistribution structure 50. The adhesive 48 may be any suitable adhesive, epoxy, glue, or the like.

The front side redistribution structure 50 comprises one or more metallization pattern 52 in one or more dielectric layer 54. The one or metallization pattern 52 can comprise any of lines, vias, pads, the like, or a combination thereof, and may comprise a conductive material, such as a metal, like copper, titanium, tungsten, aluminum, or the like. The one or more dielectric layer 54 may be a polymer such as PBO, polyimide, BCB, or the like; a nitride such as silicon nitride or the like; an oxide such as silicon oxide, PSG, BSG, BPSG, or the like; the like; or a combination thereof.

An encapsulant 56 at least laterally encapsulates the integrated circuit dies 42. The encapsulant 56 has a first surface that adjoins the redistribution structure 50 and has a second surface that is co-planar with upper surfaces of the dielectric material 46 and the die connectors 44. The encapsulant 56 may be a molding compound, epoxy, or the like.

Through vias 58 extend through the encapsulant 56, for example, from the first surface of the encapsulant 56 to the second surface of the encapsulant 56. The through vias 58 electrically couple the front side redistribution structure 50, for example, at least a portion of the one or more metallization patterns 52, with a back side redistribution structure 60, for example, at least a portion of one or more metallization patterns 62. The through vias 58 may comprise a conductive material, such as a metal, like copper, titanium, tungsten, aluminum, or the like.

The back side redistribution structure 60 comprises one or more metallization pattern 62 in one or more dielectric layer 64. At least a portion of the one or more metallization pattern 62 is electrically coupled to the respective integrated circuits on the integrated circuit dies 42 through the respective die connectors 44. The one or metallization pattern 62 can comprise any of lines, vias, pads, the like, or a combination thereof, and may comprise a conductive material, such as a metal, like copper, titanium, tungsten, aluminum, or the like. The one or more dielectric layer 64 may be a polymer such as PBO, polyimide, BCB, or the like; a nitride such as silicon nitride or the like; an oxide such as silicon oxide, PSG, BSG, BPSG, or the like; the like; or a combination thereof.

The one or more metallization pattern 62 comprises pads 66, 68, 70, and 72 exposed on the back side redistribution structure 60. The pads 66, 68, 70, and 72 may be locations for forming an anti-fuse. For example, a SMD/IPD 74, such as a resistor or any acceptable jumper, is bonded to the pads 66 and 68 to form an electrical connection between pads 66 and 68. In this example, no SMD/IPD is bonded between pads 70 and 72 such that no closed-loop circuit is formed between the pads 70 and 72. Thus, the SMD/IPD 74 may be an anti-fuse to create a closed-loop circuit to electrically couple, for example, portions of integrated circuits on integrated circuit dies 42 and/or various metallization patterns 52 and/or 62 in the redistribution structures 50 and 60. In some embodiments, the SMD/IPD 74 is a low resistance resistor, such as having a resistance less than about 0.1 ohms, and more specifically, less than about 0.05 ohms. In other embodiments, such as discussed below, other components, such as a wire bond or other acceptable jumper, may be used as an anti-fuse.

The one or more metallization pattern 62 further comprises an under-metal 76 exposed on the back side redistribution structure 60. An external connector 78, such as a solder ball like a ball grid array (BGA) ball, is on the under-metal 76. In some embodiments, the external connector 78 comprises solder, such as a Sn—Ag alloy, a Sn—Ag—Cu alloy, or the like, and may be lead-free or lead-containing.

Figure 1B:
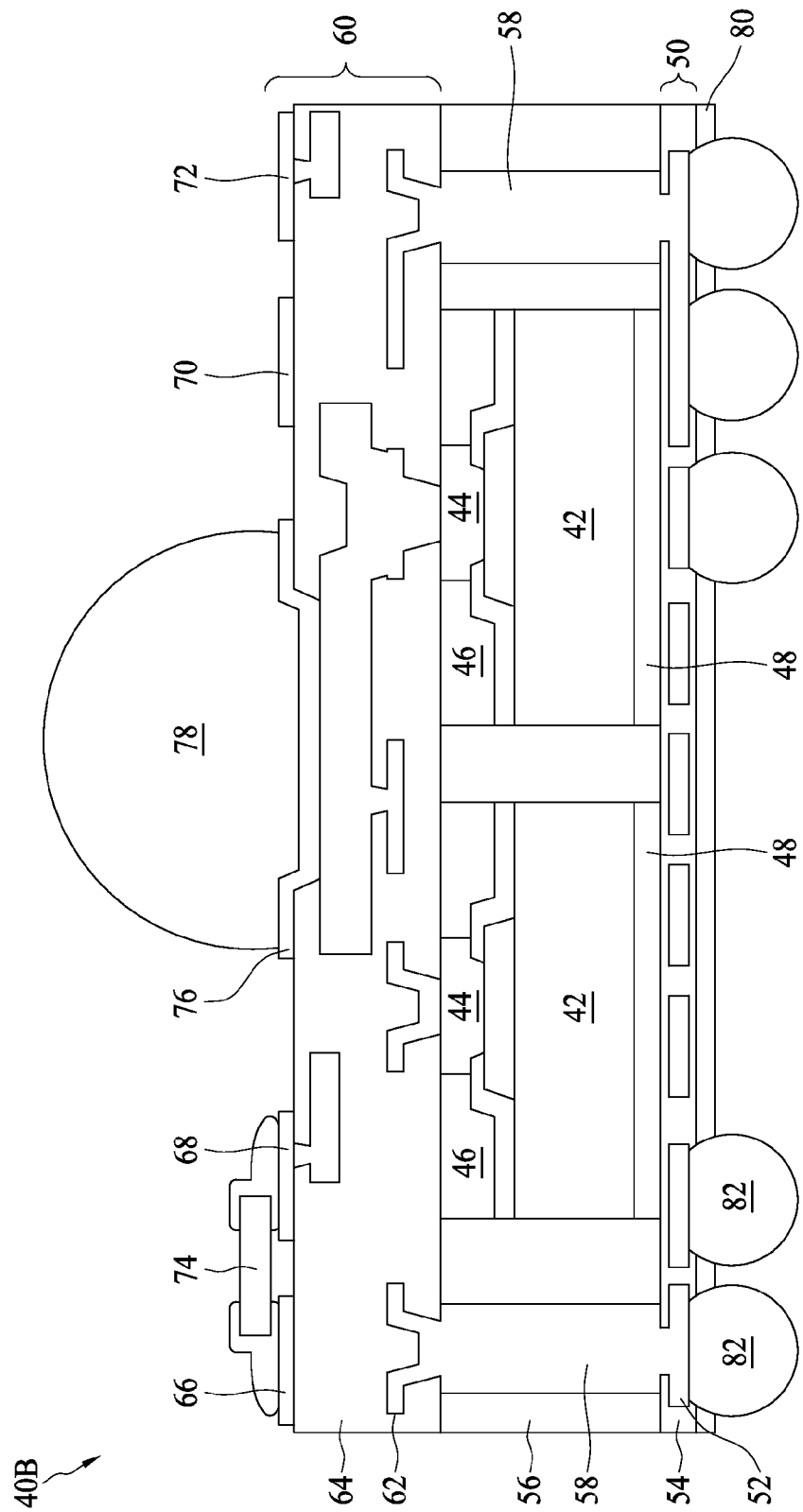
FIG. 1B is a cross sectional view of a modification of the package of FIG. 1A in accordance with some embodiments.

In FIG. 1A, a dielectric layer 64 is on the metallization pattern 62 that comprises the pads 66, 68, 70, and 72 and under-metal 76. This metallization pattern 62 can be formed, and the dielectric layer 64 subsequently deposited and patterned on this metallization pattern 62, as will become apparent in view of the process discussed with respect to FIGS. 10 through 29. The patterning of the dielectric layer 64 can expose the pads 66, 68, 70, and 72 and under-metal 76. FIG. 1B illustrates a modification. After the metallization pattern 62 that comprises the pads 66, 68, 70, and 72 and under-metal 76 is formed, no further dielectric layer is deposited on that metallization pattern 62. Although a back side redistribution structure 60 is illustrated in subsequent figures as illustrated in the package 40A of FIG. 1A, the modification of the back side redistribution structure 60 in the package 40B of FIG. 1B can be incorporated into the structure of any subsequent figure.

Referring back to FIG. 1A, pads of the one or more metallization pattern 52 of the front side redistribution structure 50 are also exposed. External connectors 82, such as solder bumps, solder balls, metal pillars, the like, or a combination such as metal pillars with solder thereon, are on the pads of the one or more metallization pattern 52. In some embodiments, the external connectors 82 comprise solder, such as a Sn—Ag alloy, a Sn—Ag—Cu alloy, or the like, and may be lead-free or lead-containing. A solder resist layer 80 is also on the front side redistribution structure 50.

Figure 2:
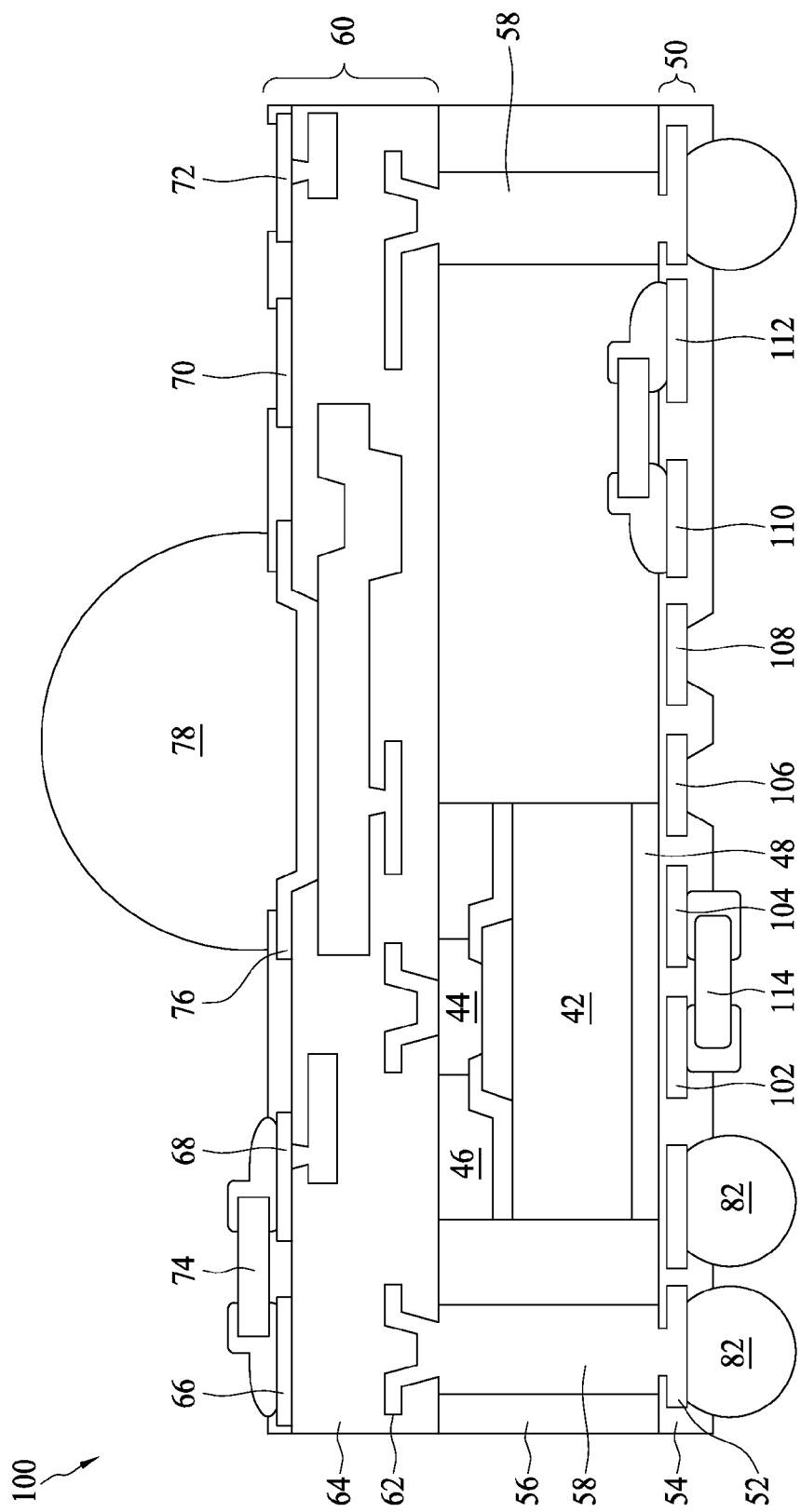
FIG. 2 is a cross sectional view of another package in accordance with some embodiments.

FIG. 2 illustrates a package 100 that comprises one or more integrated circuit dies 42 that is programmed by one or more SMD/IPD disposed on or in the package 100 in accordance with some embodiments. The package 100 is generally similar to the packages 40A and 40B in FIGS. 1A and 1B, and thus, discussion of features that are discussed above with respect to FIGS. 1A and 1B and illustrated in FIG. 2 is omitted herein.

The one or more metallization pattern 52 comprises pads 102, 104, 106, 108, 110, and 112. The pads 102, 104, 106, 108, 110, and 112 may be locations for forming an anti-fuse. For example, a SMD/IPD 114, such as a resistor or any acceptable jumper, is bonded to the pads 102 and 104 to form an electrical connection between pads 102 and 104. The SMD/IPD 114 is on an exterior surface of the package 100. Further in this example, a SMD/IPD 116, such as a resistor or any acceptable jumper, is bonded to the pads 110 and 112 to form an electrical connection between pads 110 and 112. The SMD/IPD 116 is embedded in the encapsulant 56. Hence, the SMD/IPD 116 is disposed on an opposite side of the front side redistribution structure 50 from the SMD/IPD 114. In this example, no SMD/IPD is bonded between pads 106 and 108 such that no closed-loop circuit is formed between the pads 106 and 108. Thus, the SMD/IPDs 114 and 116 may be an anti-fuse to create a closed-loop circuit to electrically couple, for example, portions of an integrated circuit on the integrated circuit die 42 and/or various metallization patterns 50 and/or 62 in the redistribution structures 50 and 60. In some embodiments, the SMD/IPDs 114 and 116 are low resistance resistors, such as having a resistance less than about 0.1 ohms, and more specifically, less than about 0.05 ohms. In other embodiments, such as discussed below, other components, such as a wire bond or other acceptable jumper, may be used as an anti-fuse. This illustrated embodiment shows multiple locations where an anti-fuse may be placed in the package 100.

Figure 3:
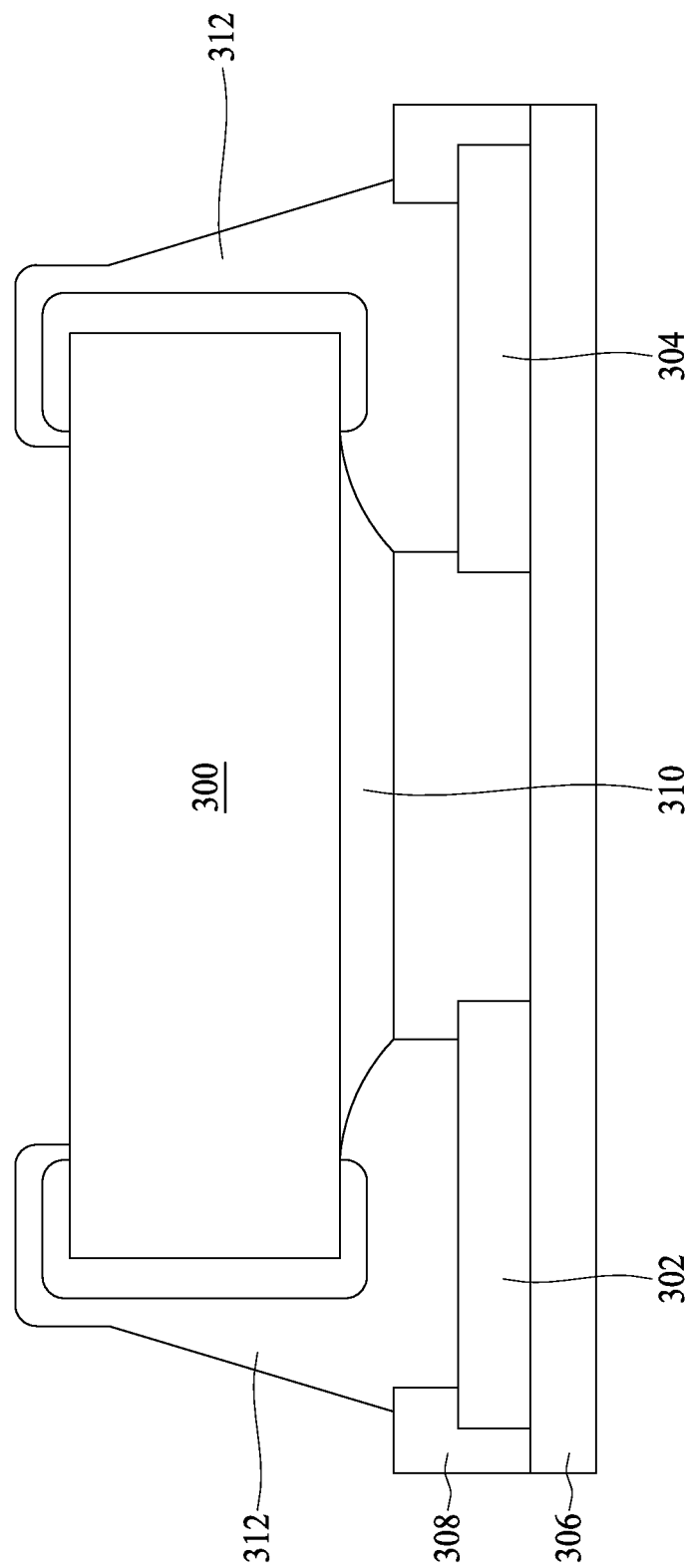
FIG. 3 is a cross sectional view of a portion of a package in accordance with some embodiments.

FIG. 3 illustrates a cross section view of a SMD/IPD 300 on pads 302 and 304 in accordance with some embodiments. The SMD/IPD 300 can be any of the SMD/IPDs 74, 114, and 116 illustrated in FIGS. 1A and 2, and hence, the modification(s) shown in FIG. 3 may be applied to the packages of FIGS. 1A and 2. Further, the SMD/IPD 300 can be any SMD/IPD, such as a capacitor, resistor, or the like, for any application. FIG. 3 illustrates dielectric layers 306 and 308. The pads 302 and 304 are on dielectric layer 306, and dielectric layer 308 is on the dielectric layer 306 and the pads 302 and 304 with openings through the dielectric layer 308 to the pads 302 and 304. Each of the dielectric layers 306 and 308 may be a polymer such as PBO, polyimide, BCB, or the like; a nitride such as silicon nitride or the like; an oxide such as silicon oxide, PSG, BSG, BPSG, or the like; the like; or a combination thereof, as discussed above. The pads 302 and 304 may be part of a metallization pattern and may comprise a conductive material, such as a metal, like copper, titanium, tungsten, aluminum, or the like. A spacer material 310 is disposed on an outer surface of the dielectric layer 308 between the pads 302 and 304. The spacer material 310 may be an underfill material, a spacer gel, or spacer tape, which may further be an epoxy, an organic material, or the like. The SMD/IPD 300 is attached between the pads 302 and 304 using solder 312. The SMD/IPD 300 can contact the spacer material 310 disposed on the dielectric layer 308 and between the pads 302 and 304.

Figure 4A:
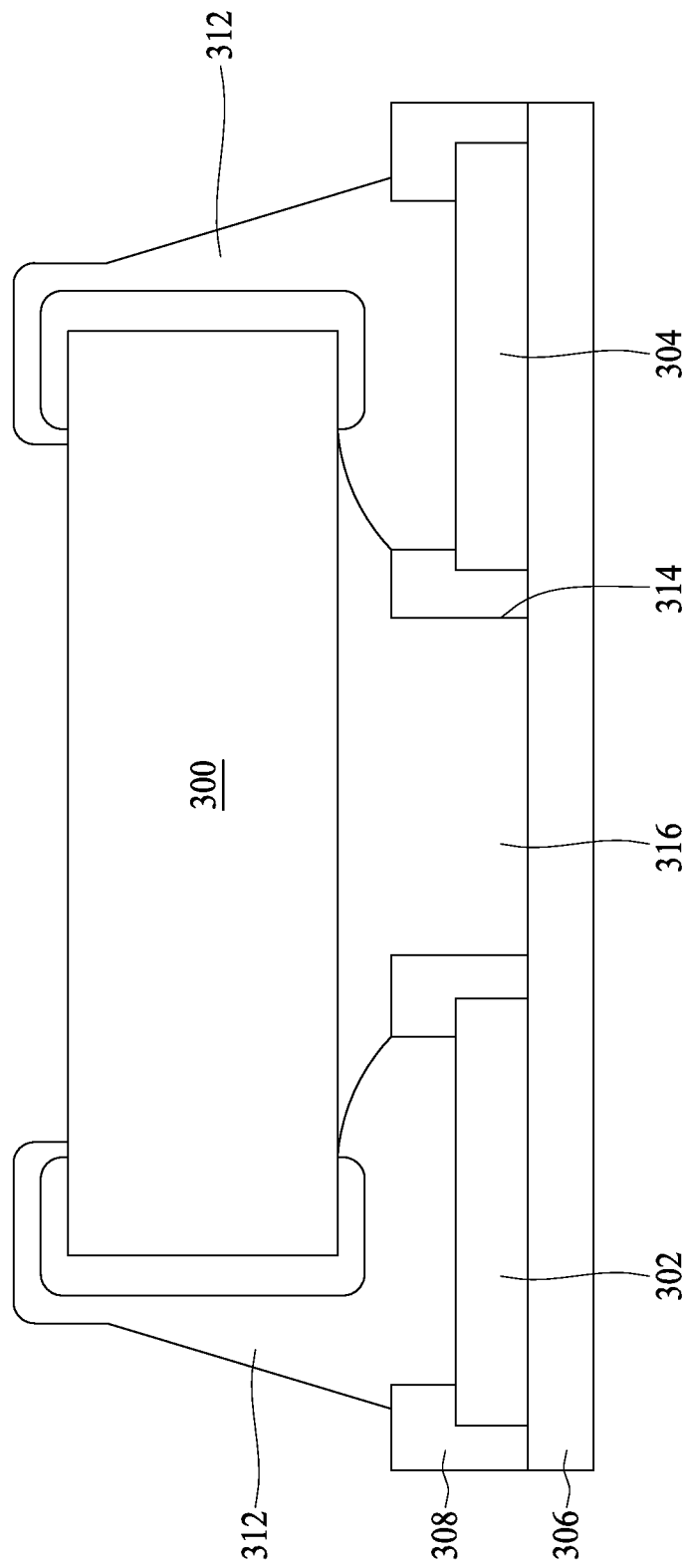

FIGS. 4A and 4B illustrate a modification of FIG. 3. In the cross section view of FIG. 4A, a gap 314 is formed through the dielectric layer 308 between the pads 302 and 304. The gap 314 may be an opening through the dielectric layer 308 to the dielectric layer 306. In some embodiments, the depth of the gap 314 may be in a range from about 5 µm to about 10 µm. A spacer material 316 is disposed in the gap 314 and on an outer surface of the dielectric layer 308 between the pads 302 and 304. The spacer material 316 may be an underfill material, a spacer gel, or spacer tape, which may further be an epoxy, an organic material, or the like. The SMD/IPD 300 can contact the spacer material 316 disposed in the gap 314 and on the dielectric layer 308 between the pads 302 and 304.

FIG. 4B illustrates a layout view of components in FIG. 4A. The gap 314 in the dielectric layer 308 is shown between the pads 302 and 304. In some embodiments, a first dimension D1 of the pads 302 and 304 is in a range from about 0.45 mm to about 0.55 mm, and a second dimension D2 of the pads 302 and 304 is in a range from about 0.40 mm to about 0.50 mm. A spacing S from the pad 302 to the pad 304 can be in a range from about 0.45 mm to about 0.55 mm. The gap 314 has a length L that is larger than the first dimension D1 of the pads 302 and 304, which may be in a range from about 0.50 mm to about 0.60 mm in some embodiments. The gap 314 has a width W that is less than the spacing S between the pads 302 and 304, which may be in a range from about 0.1 mm to about 0.5 mm in some embodiments.

Figure 5:
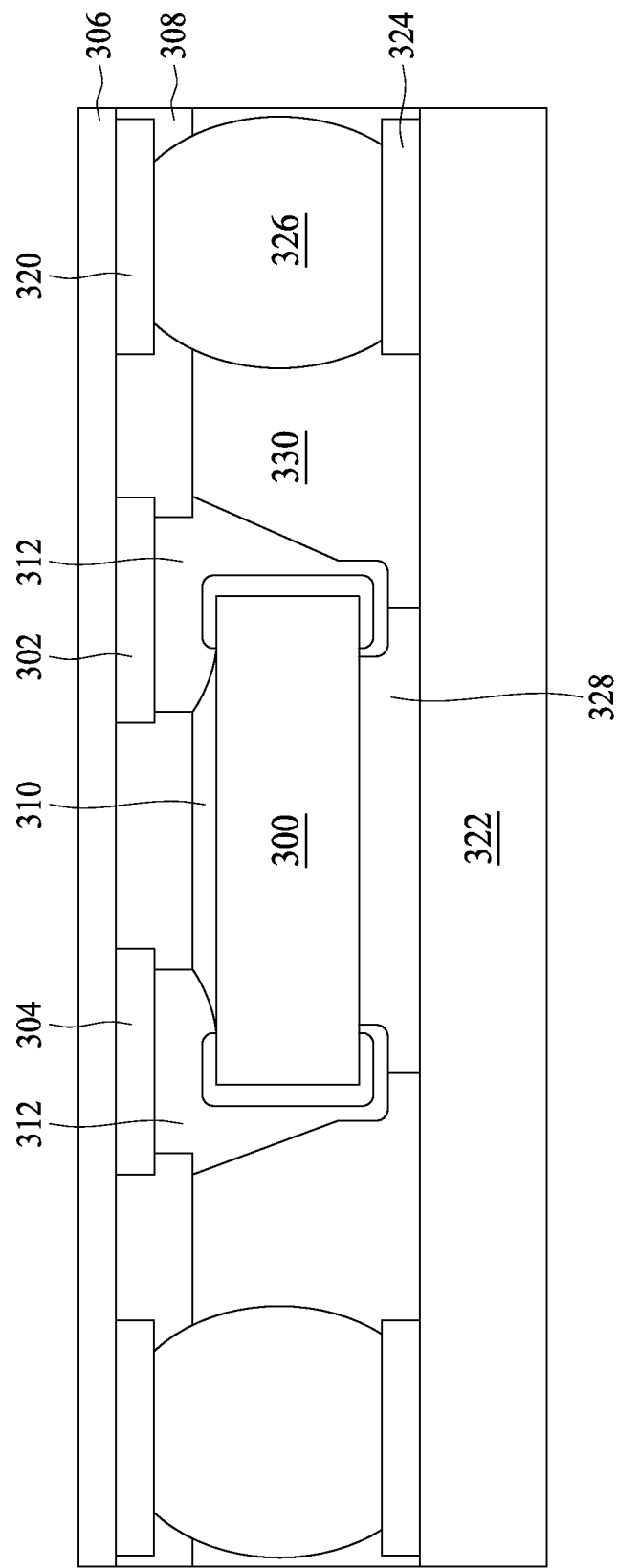
FIGS. 5 through 7 are each a cross sectional view of a portion of a package in accordance with some embodiments.
Figure 6:
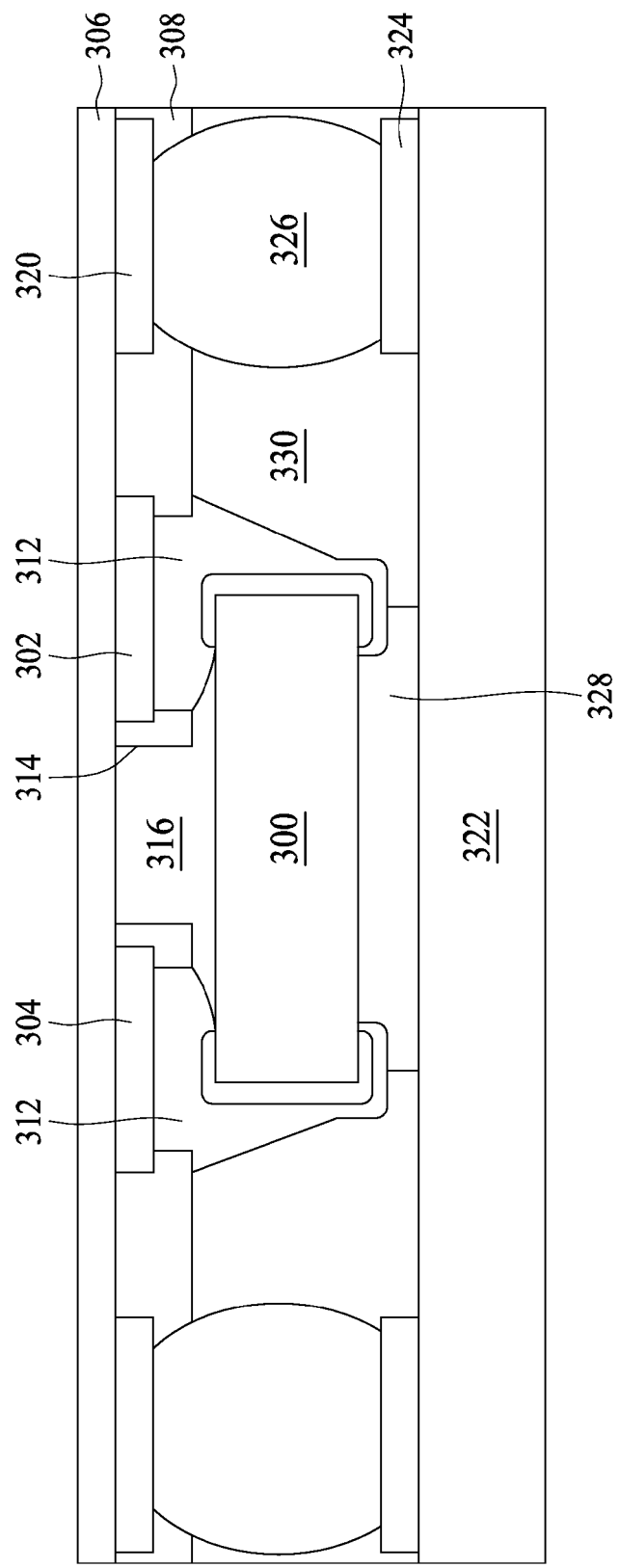

FIGS. 5 and 6 illustrate additional aspects of some embodiments. As one of ordinary skill in the art will readily understand, the packages illustrated in FIGS. 1A and 2 would be attached to one or more other package components, such as another package or a substrate, such as a Printed Circuit Board (PCB). FIGS. 5 and 6 illustrate portions of a package, including the portions shown in FIGS. 3 and 4A, respectively, attached to a package component 322. The package, on which the SMD/IPD 300 is attached, further includes under-metals 320, which may be in the same metallization pattern as the pads 302 and 304, on the dielectric layer 306 and exposed through openings through the dielectric layer 308. The package is attached to the package component 322 using external connectors 326, such as external connectors 78 or 82. A spacer material 328 is on the package component 322 in an area corresponding to the location of the SMD/IPD 300 when the package is attached to the package component 322. Hence, the spacer material 328 is disposed between the SMD/IPD 300 and the package component 322 when the package is attached to the package component 322. The SMD/IPD 300 may contact the spacer material 328. The spacer material 328 may be an underfill material, a spacer gel, or spacer tape, which may further be an epoxy, an organic material, or the like. An underfill material 330, separate from the spacer material 310, 316, and 328, is disposed between the package and the package component 322 and surrounds the various components, including the external connectors 326 and SMD/IPD 300, between the package and the package component 322. In some embodiments, the spacer material 328 may be omitted from the structures illustrated in FIGS. 5 and 6, such as, for example, when a space between the SMD/IPD 300 and the package component 322 is large enough to allow the underfill material 330 to flow between and fill the space between the SMD/IPD 300 and the package component 322.

Figure 7:
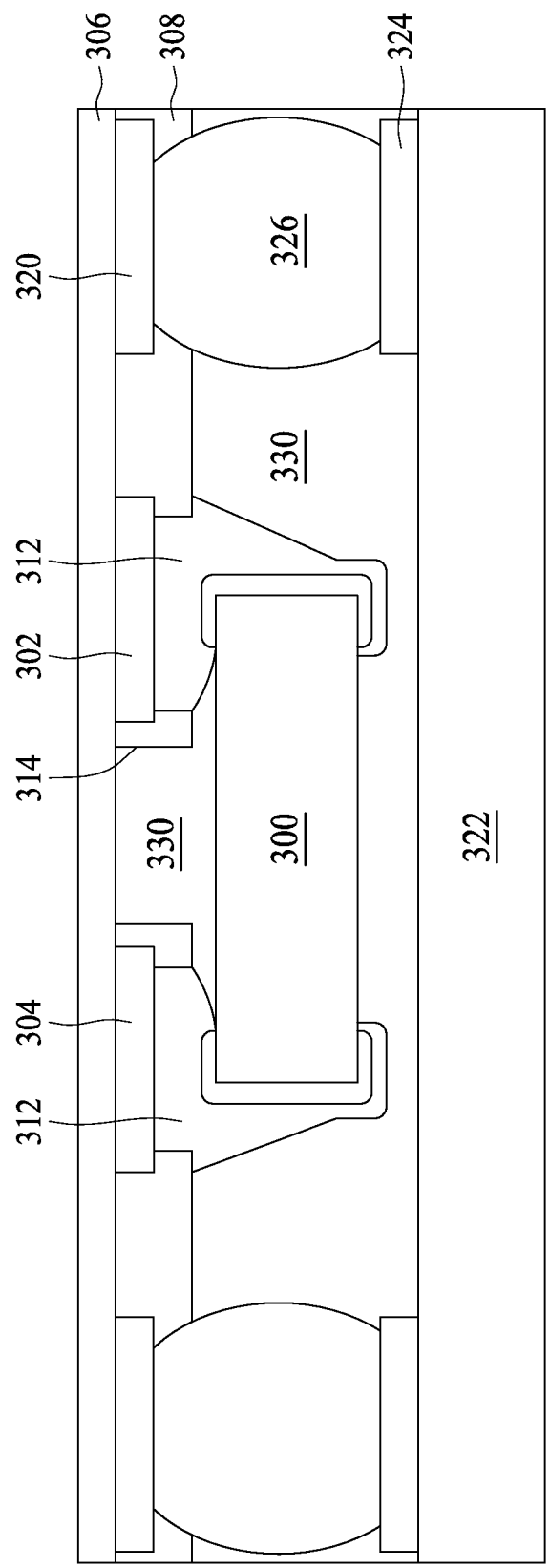

FIG. 7 illustrates a modification of FIG. 6. In the structure illustrated in FIG. 7, the underfill material 330 acts as a spacer material in the place of spacer material 316 and 328. The presence of the gap 314 allows the underfill material 330 to more freely flow between the SMD/IPD 300 and the package. Further, a space between the SMD/IPD 300 and the package component 322 is large enough to allow the underfill material 330 to flow between and fill the space between the SMD/IPD 300 and the package component 322. Hence, the underfill material 330 that is dispensed after the package is attached to the package component 322 can flow between the SMD/IPD 300 and the package, and between the SMD/IPD 300 and the package component 322 to act as a spacer material. In some embodiments, the spacer material 328 illustrated in FIG. 6 may be included in the structure illustrated in FIG. 7.

Although generally depicted between the package and the package component 322, aspects of FIG. 7 may be applied in other circumstances. For example, the gap 314 may be formed in the dielectric layer 54 for the SMD/IPD 116 illustrated in FIG. 2. The encapsulant 56 then could function as the underfill material 330 in FIG. 7 and could flow into gap 314 between the SMD/IPD 116 and the front side redistribution structure 50 to act as a spacer material.

Figure 8:
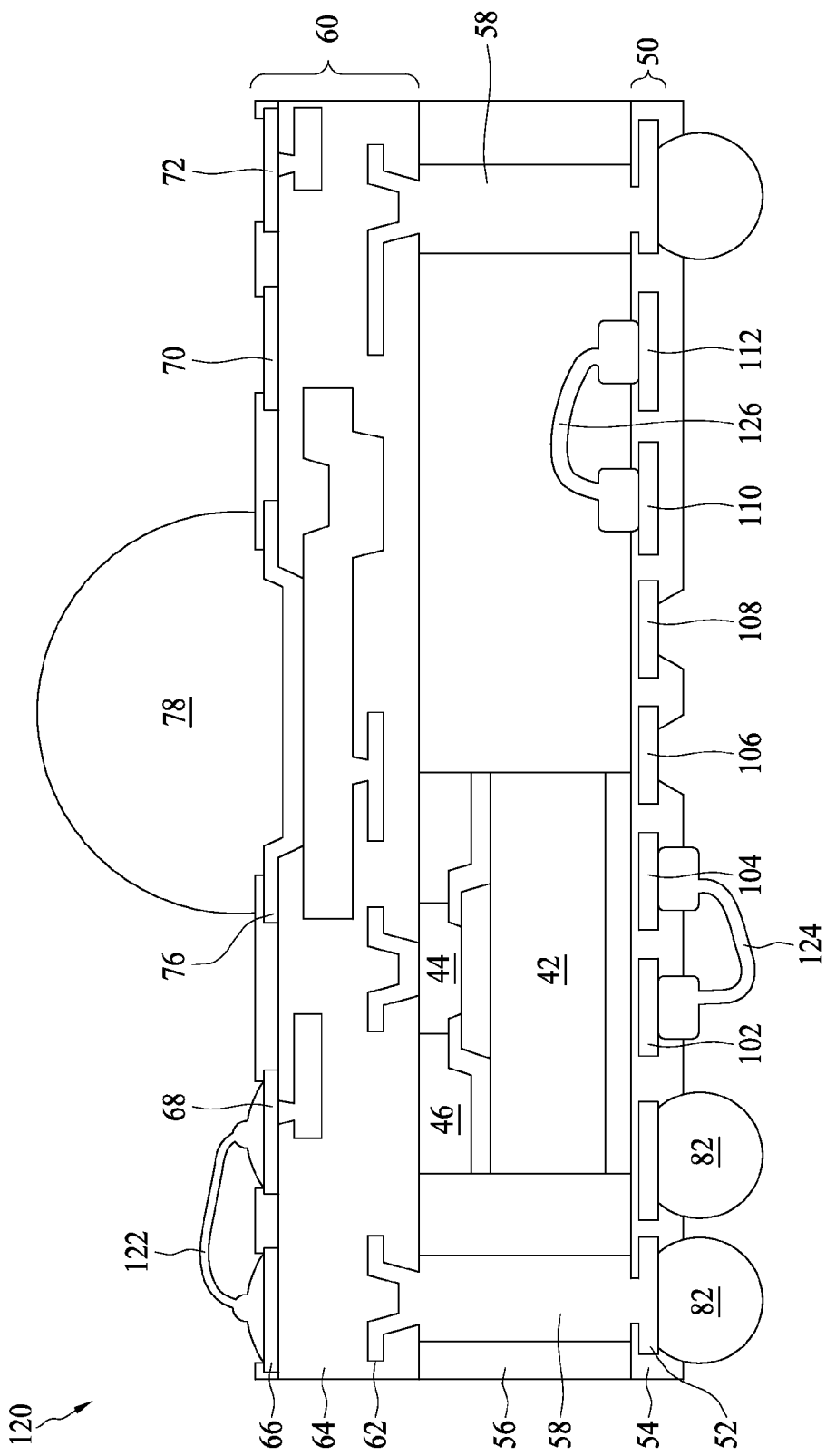
FIG. 8 is a cross sectional view of a further package in accordance with some embodiments.

FIG. 8 illustrates a package 120 that comprises one or more integrated circuit dies 42 that is programmed by one or more wire bond disposed on or in the package 120 in accordance with some embodiments. The package 120 is generally similar to the packages 40A, 40B, and 100 in FIGS. 1A, 1B, and 2, respectively, and thus, discussion of features that are discussed above with respect to FIGS. 1A, 1B, and 2 and illustrated in FIG. 8 is omitted herein.

Wire bonds 122, 124, and 126 are used in the place of SMD/IPDs 74, 114, and 116, respectively, as anti-fuses in FIG. 8. The wire bonds 122, 124, and 126 may comprise any acceptable wire, such as copper, gold, aluminum, silver, platinum, palladium, tin, the like, or composites thereof. This illustrated embodiment shows that another jumper, for example, a wire bond, may be used as an anti-fuse in the package 120.

Figure 9A:
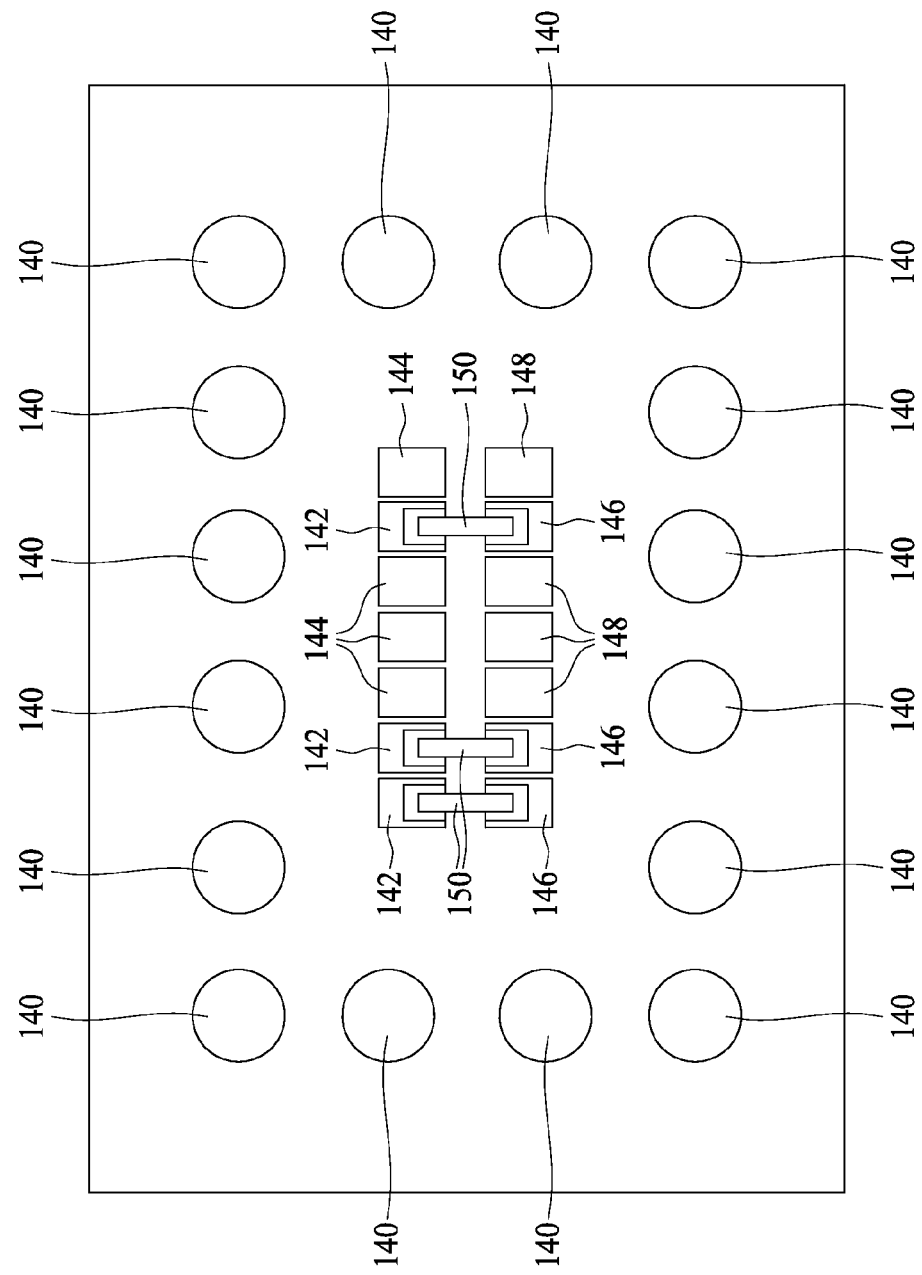
FIGS. 9A and 9B are layout views of exterior surfaces of a redistribution structure in accordance with some embodiments.
Figure 9B:
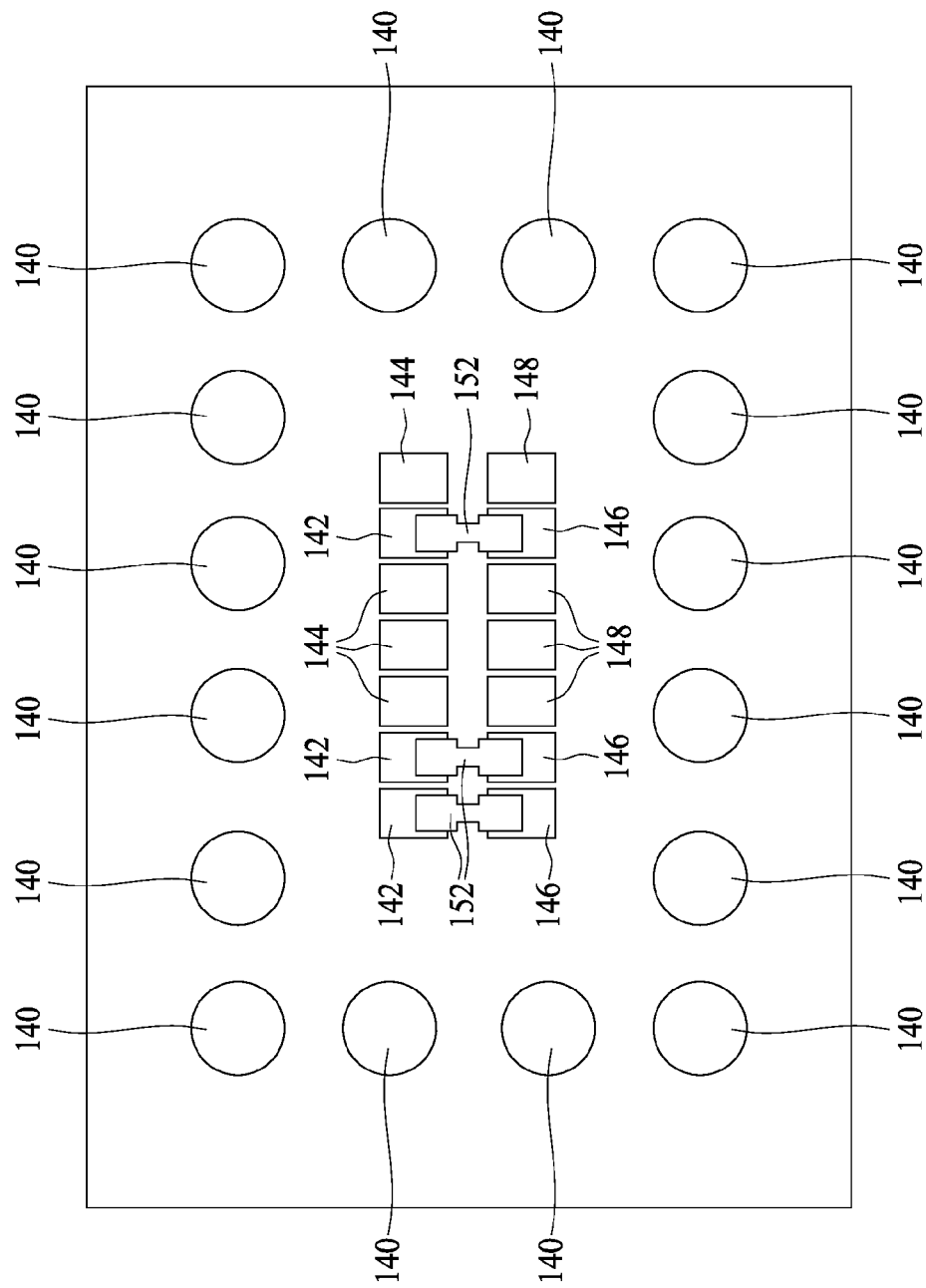

FIGS. 9A and 9B illustrate layout views of exterior surfaces of the back side redistribution structure 60 in accordance with some embodiments. Similar layouts may also be used for exterior surfaces of the front side redistribution structure 50. Aspects of these layouts may be applied at any location where an anti-fuse may be located.

The exterior surfaces comprise pads 140, 142, 144, 146, and 148. The pads 140 may be for electrically and mechanically coupling external electrical connectors, such as connectors 78 and/or 82 discussed above. For example, the pads 140 may be for BGA balls. The pads 140, in these embodiments, encircle an anti-fuse area in which pads 142, 144, 146, and 148 are disposed. Pads 142, 144, 146, and 148 are used to connect or not connect a jumper, such as a SMD/IPD 150 or wire bond 152, to program the integrated circuit(s) on an integrated circuit die(s). In FIG. 9A, SMD/IPDs 150, such as a resistor, are connected between corresponding pads 142 and 146, while no anti-fuse is connected between corresponding pads 144 and 148. In FIG. 9B, wire bonds 152 are connected between corresponding pads 142 and 146, while no anti-fuse is connected between corresponding pads 144 and 148. By connecting the SMD/IPDs 150 or the wire bonds 152 between pads 142 and 146, a closed circuit is formed, while a circuit remains open between pads 144 and 148 because no anti-fuse is connected between pads 144 and 148. Hence, the SMD/IPDs 150, wire bonds 152, or other jumpers may be used as an anti-fuse.

The layouts in FIGS. 9A and 9B illustrate that pads for anti-fuses may have any number of pairs of pads for connecting anti-fuses. Further, a package may have any number of areas for pads for anti-fuses on any surface, such as exterior surfaces or embedded, interior surfaces. Additionally, any combination of SMDs, IPDs, wire bonds, or other jumpers may be used in a package as an anti-fuse.

Figure 10:
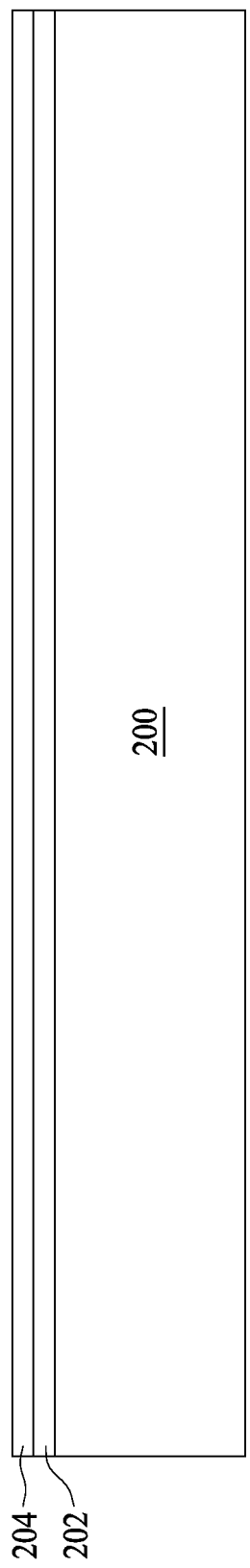
FIGS. 10 through 29 are cross sectional views of intermediate steps during a process for forming a package-on-package structure in accordance with some embodiments.

FIGS. 10 through 29 illustrate cross sectional views of intermediate steps during a process for forming a package-on-package structure in accordance with some embodiments. FIG. 10 illustrates a carrier 200 and a release layer 202 formed on the carrier 200. The carrier 200 may be a glass carrier, a ceramic carrier, or the like. The carrier 200 may be a wafer. The release layer 202 may be formed of a polymer-based material, which may be removed along with the carrier 200 from the overlying structures that will be formed in subsequent steps. In some embodiments, the release layer 202 is an epoxy-based thermal-release material, which loses its adhesive property when heated. In other embodiments, the release layer 202 may be an ultra-violet (UV) glue, which loses its adhesive property when exposed to UV lights. The release layer 202 may be dispensed as a liquid and cured, may be a laminate film laminated onto the carrier 200, or may be the like. The top surface of the release layer 202 may be leveled and may have a high degree of co-planarity.

A dielectric layer 204 is formed on the release layer 202. The bottom surface of the dielectric layer 204 may be in contact with the top surface of the release layer 202. In some embodiments, the dielectric layer 204 is formed of a polymer, such as PBO, polyimide, BCB, or the like. In other embodiments, the dielectric layer 204 is formed of a nitride such as silicon nitride; an oxide such as silicon oxide, PSG, BSG, BPSG, or the like; or the like. The dielectric layer 204 may be formed by any acceptable deposition process, such as spin coating, chemical vapor deposition (CVD), laminating, the like, or a combination thereof.

Figure 11:
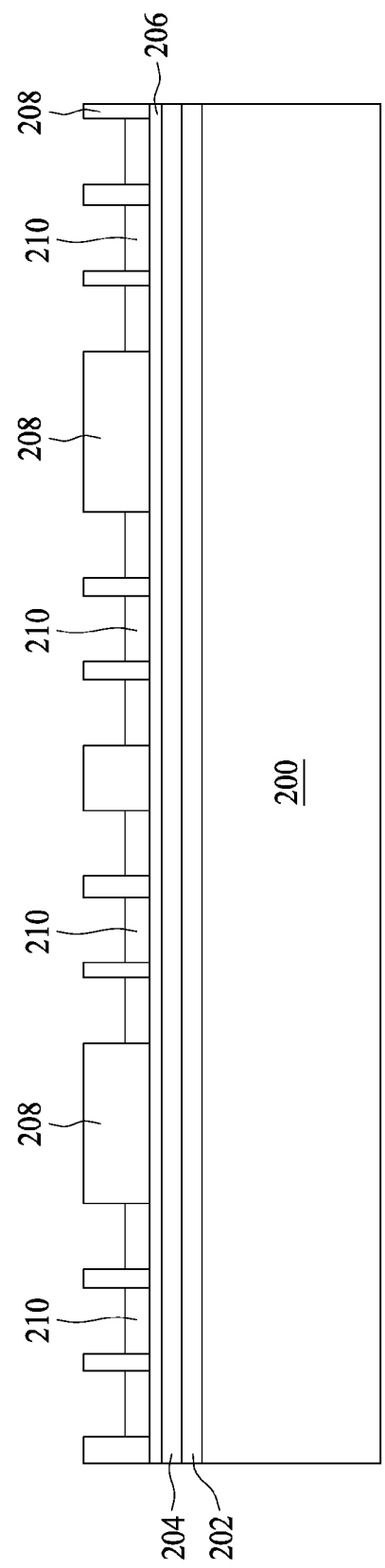

Referring to FIG. 11, a seed layer 206 is formed over the dielectric layer 204. In some embodiments, the seed layer 206 is a metal layer, which may be a single layer or a composite layer comprising a plurality of sub-layers formed of different materials. In some embodiments, the seed layer 206 comprises a titanium layer and a copper layer over the titanium layer. The seed layer 206 may be formed using, for example, Physical Vapor Deposition (PVD) or the like.

A photo resist 208 is formed and patterned on the seed layer 206. The photo resist 208 may be formed by spin coating or the like and may be exposed to light for patterning. The pattern of the photo resist 208 corresponds to a metallization pattern. The patterning forms openings through the photo resist 208 to expose the seed layer 206.

A conductive material 210 is formed in the openings of the photo resist 208 and on the exposed portions of the seed layer 206. The conductive material 210 may be formed by plating, such as electroplating or electroless plating, or the like. The conductive material 210 may comprise a conductive material, such as a metal, like copper, titanium, tungsten, aluminum, or the like.

Figure 12:
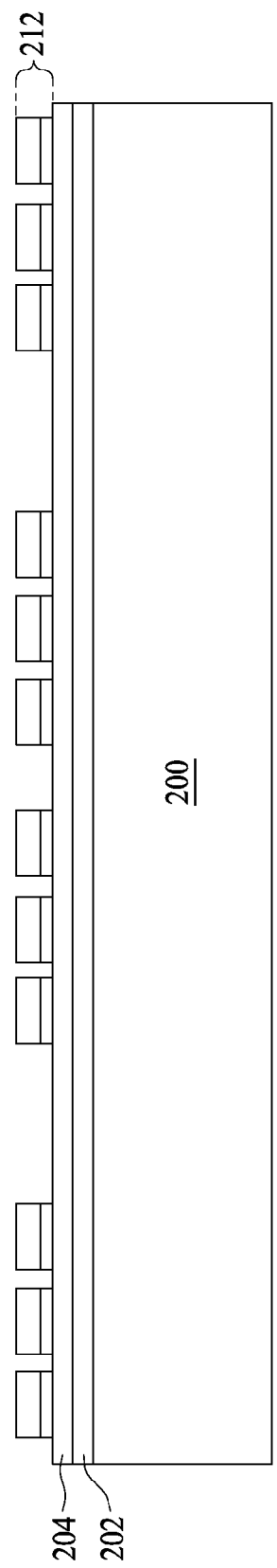

In FIG. 12, the photo resist 208 and portions of the seed layer 206 on which the conductive material 210 is not formed are removed. The photo resist 208 may be removed by an acceptable ashing or stripping process, such as using an oxygen plasma or the like. Once the photo resist 208 is removed, exposed portions of the seed layer 206 are removed, such as by using an acceptable etching process, such as by wet or dry etching. The remaining portions of the seed layer 206 and conductive material 210 form a metallization pattern 212.

Figure 13:
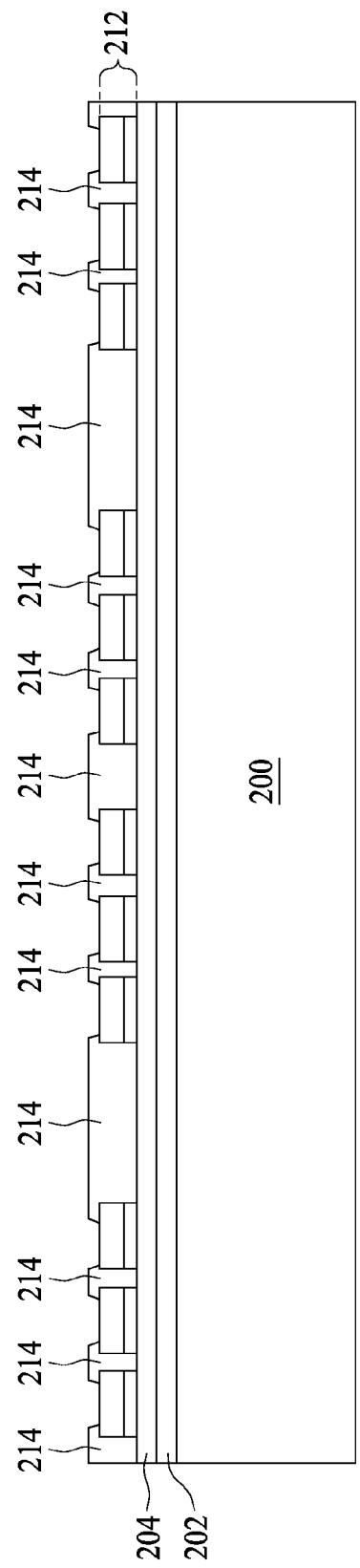

In FIG. 13, a dielectric layer 214 is formed on the metallization pattern 212 and the dielectric layer 204. In some embodiments, the dielectric layer 214 is formed of a polymer, which may be a photo-sensitive material such as PBO, polyimide, BCB, or the like, that may be easily patterned using a lithography mask. In other embodiments, the dielectric layer 214 is formed of a nitride such as silicon nitride; an oxide such as silicon oxide, PSG, BSG, BPSG; or the like. The dielectric layer 214 may be formed by spin coating, lamination, CVD, the like, or a combination thereof. The dielectric layer 214 is then patterned to form openings to expose portions of the metallization pattern 212. The patterning may be by an acceptable process, such as by exposing the dielectric layer 214 to light when the dielectric layer is a photo-sensitive material or by etching using, for example, an anisotropic etch.

Figure 14:
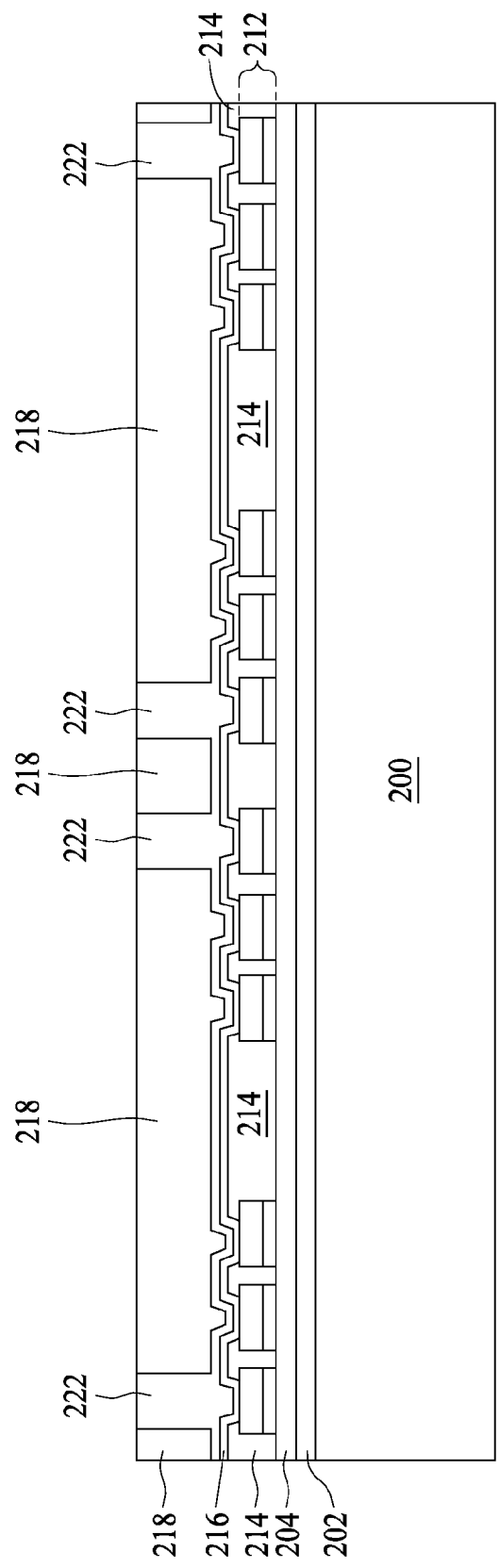

Referring to FIG. 14, a seed layer 216 is formed over the dielectric layer 214 and the exposed portions of the metallization pattern 212. In some embodiments, the seed layer 216 is a metal layer, which may be a single layer or a composite layer comprising a plurality of sub-layers formed of different materials. In some embodiments, the seed layer 216 comprises a titanium layer and a copper layer over the titanium layer. The seed layer 216 may be formed using, for example, PVD or the like.

A photo resist 218 is formed and patterned on the seed layer 216. The photo resist 218 may be formed by spin coating or the like and may be exposed to light for patterning. The pattern of the photo resist 218 corresponds to through vias. The patterning forms openings through the photo resist 218 to expose the seed layer 216.

A conductive material 220 is formed in the openings of the photo resist 218 and on the exposed portions of the seed layer 216. The conductive material 220 may be formed by plating, such as electroplating or electroless plating, or the like. The conductive material 220 may comprise a conductive material, such as a metal, like copper, titanium, tungsten, aluminum, or the like.

Figure 15:
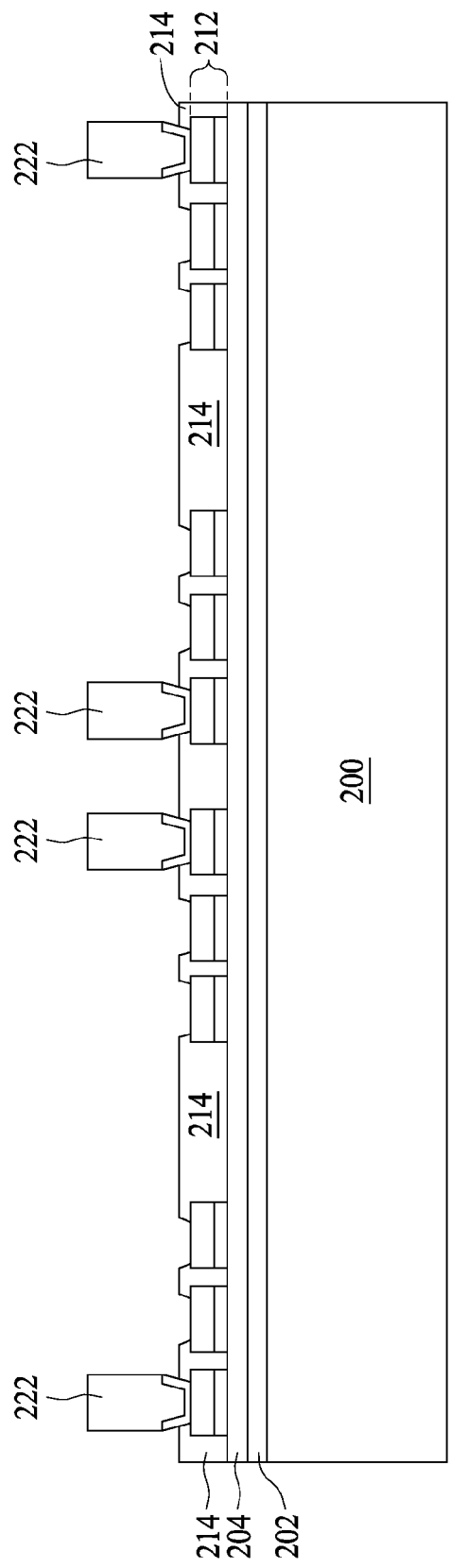

In FIG. 15, the photo resist 218 and portions of the seed layer 216 on which the conductive material 220 is not formed are removed. The photo resist 218 may be removed by an acceptable ashing or stripping process, such as using an oxygen plasma or the like. Once the photo resist 218 is removed, exposed portions of the seed layer 216 are removed, such as by using an acceptable etching process, such as by wet or dry etching. The remaining portions of the seed layer 216 and conductive material 220 form through vias 222.

Figure 16:
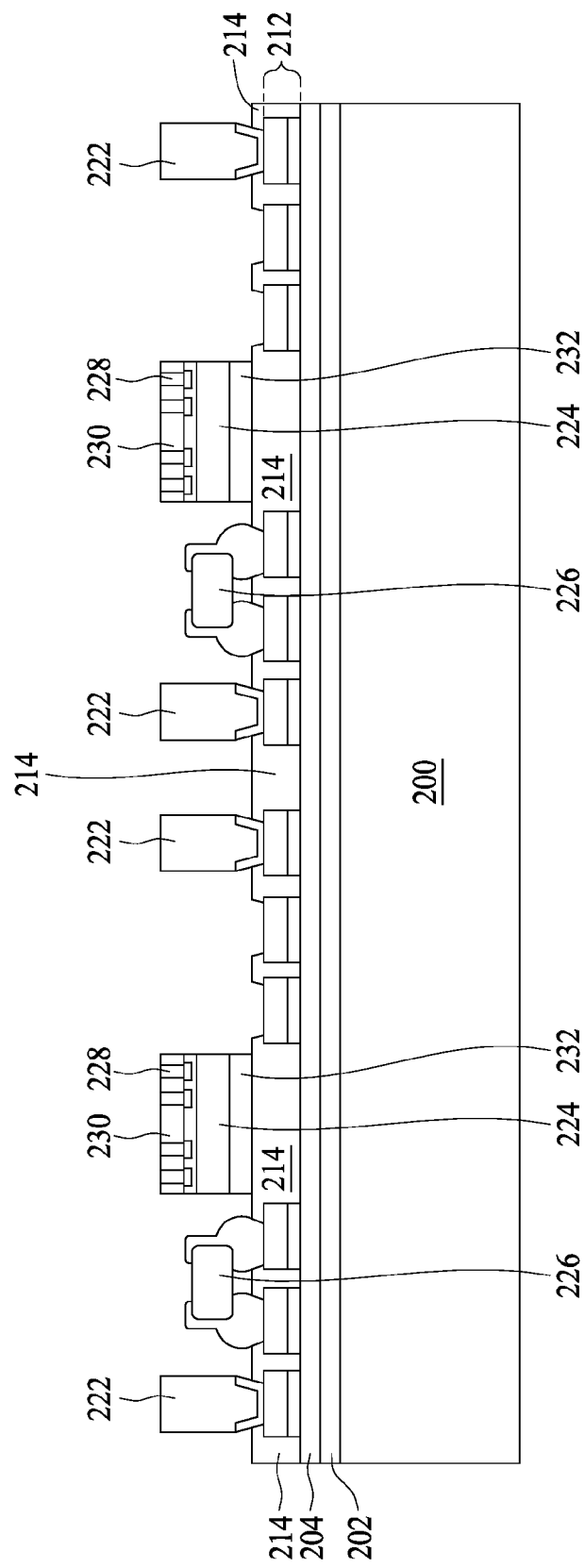

In FIG. 16, integrated circuit dies 224 are adhered to the dielectric layer 214, and SMD/IPDs 226 are bonded to exposed portions of the metallization pattern 212. Before being adhered to the dielectric layer 214, the integrated circuit dies 224 may be processed according to applicable manufacturing processes to form integrated circuits in the integrated circuit dies 224. For example, devices, such as transistors, diodes, capacitors, resistors, etc., may be formed in and/or on a semiconductor substrate, such as a semiconductor wafer, and may be interconnected by interconnect structures formed by, for example, metallization patterns in one or more dielectric layers on the semiconductor substrate to form an integrated circuit. Die connectors 228, such as conductive pillars or vias (for example, comprising a metal such as copper), may be formed exterior to the integrated circuit dies 224 by, for example, plating to be mechanically and electrically coupled to the respective integrated circuit dies 224 on what may be referred to as respective active sides of the integrated circuit dies 224. A dielectric material 230 may be formed over the integrated circuit dies 224 and the die connectors 228, for example, by spin coating, lamination, CVD, or the like. An adhesive 232 may be applied to a back side of the integrated circuit dies 224, such as to a back side of the respective semiconductor wafer. The adhesive 232 may be any suitable adhesive, epoxy, glue, or the like. The integrated circuit dies 224 may be singulated, such as by sawing or dicing, and adhered to the dielectric layer 214 by the adhesive 232 using, for example, a pick-and-place tool.

SMD/IPDs 226 are connected between exposed portions, e.g., pads, of the metallization pattern 212. The SMD/IPDs 226 may be connected to the exposed portions of the metallization pattern 212 using, for example, a pick-and-place tool, and bonding the SMD/IPDs 226 to the exposed portions by metal-to-metal bonding, solder reflowing, or the like. In some embodiments, the SMD/IPDs 226 are low resistance resistors, such as having a resistance less than about 0.1 ohms, and more specifically, less than about 0.05 ohms. In other embodiments, other components, such as a wire bond or other acceptable jumper, may be used as an anti-fuse between the exposed portions, e.g., pads, of the metallization pattern 212. When a wire bond is used, any acceptable wire bonding technique may be used to form the wire bond on the exposed portions of the metallization pattern. One of ordinary skill in the art will readily understand other appropriate techniques for forming other jumpers.

Figure 17:
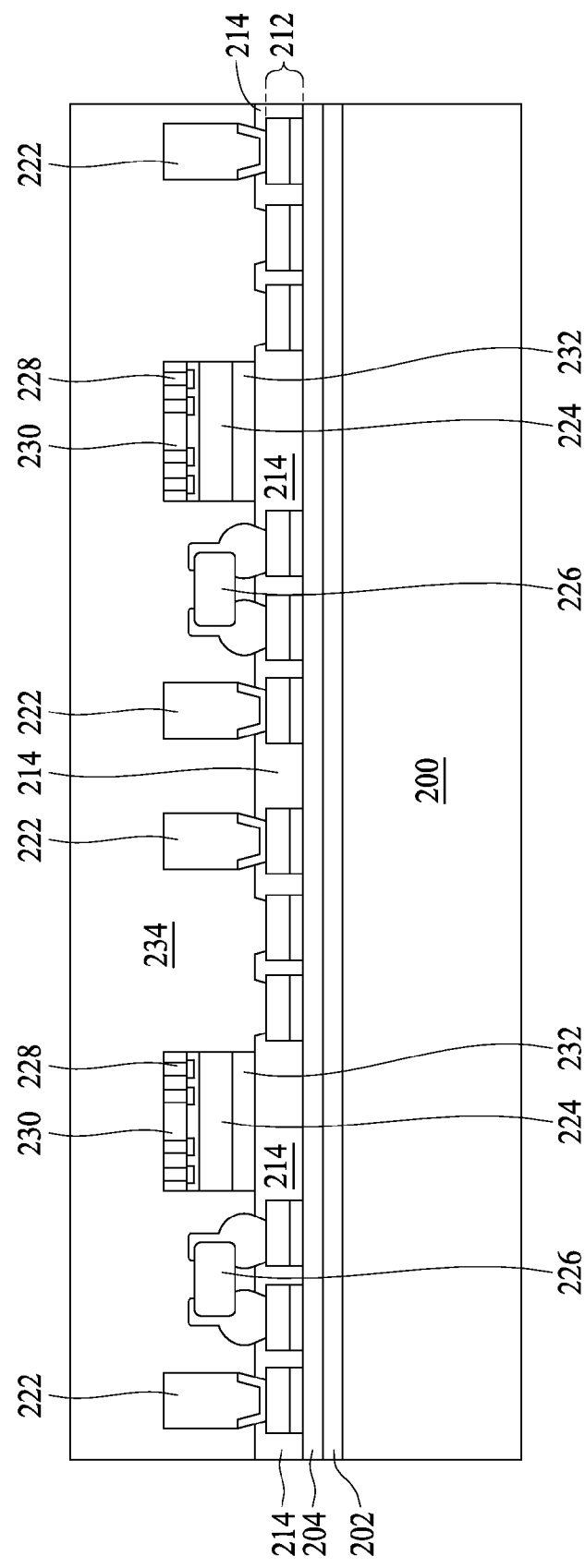
Figure 18:
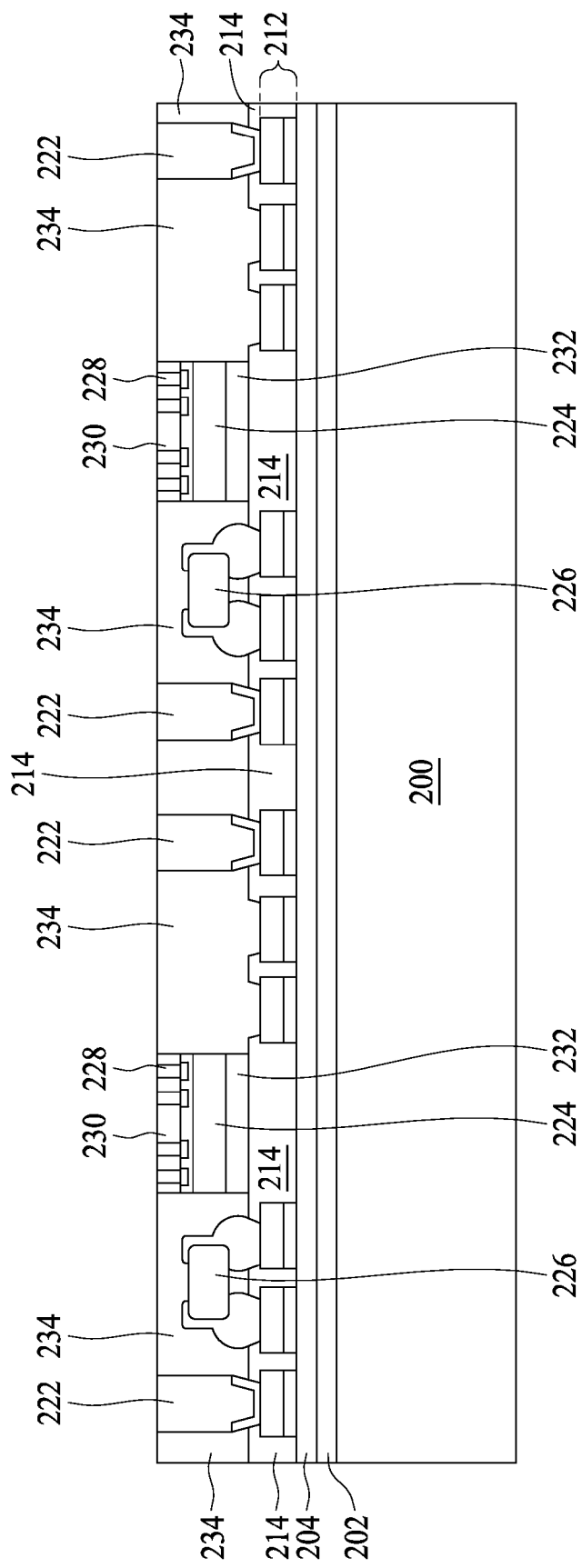

In FIG. 17, an encapsulant 234 is formed on the various components. The encapsulant 234 may be a molding compound, epoxy, or the like, and may be applied by compression molding, transfer molding, or the like. In FIG. 18, after curing, the encapsulant 234 undergoes a grinding process to expose the through vias 222 and die connectors 228. Top surfaces of the through vias 222, die connectors 228, and encapsulant 234 are co-planar after the grinding process. The SMD/IPDs 226 may remain embedded in the encapsulant 234.

Figure 19:
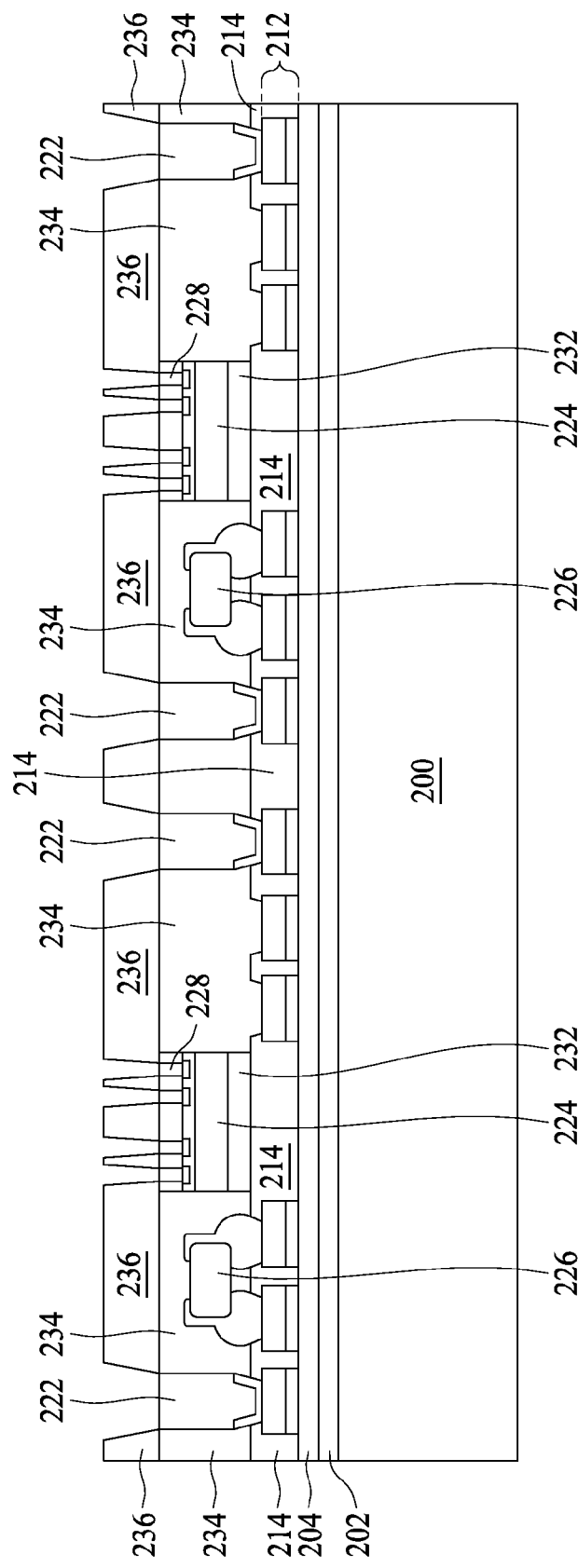

In FIG. 19, a dielectric layer 236 is formed on the encapsulant 234, through vias 222, and die connectors 228. In some embodiments, the dielectric layer 236 is formed of a polymer, which may be a photo-sensitive material such as PBO, polyimide, BCB, or the like, that may be easily patterned using a lithography mask. In other embodiments, the dielectric layer 236 is formed of a nitride such as silicon nitride; an oxide such as silicon oxide, PSG, BSG, BPSG; or the like. The dielectric layer 236 may be formed by spin coating, lamination, CVD, the like, or a combination thereof. The dielectric layer 236 is then patterned to form openings to expose the through vias 222 and the die connectors 228. The patterning may be by an acceptable process, such as by exposing the dielectric layer 236 to light when the dielectric layer is a photo-sensitive material or by etching using, for example, an anisotropic etch.

Figure 20:
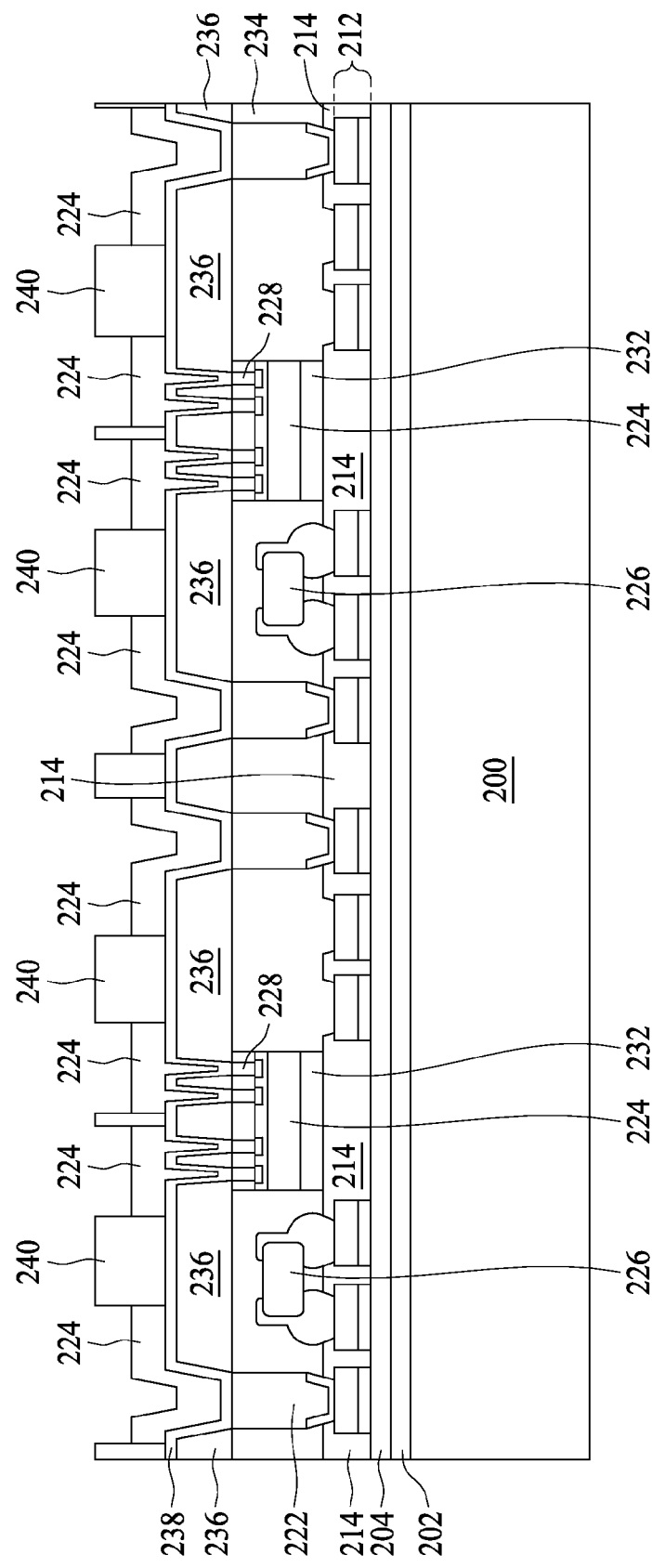

In FIG. 20, a seed layer 238 is formed over the dielectric layer 236 and in openings in the dielectric layer 236. In some embodiments, the seed layer 238 is a metal layer, which may be a single layer or a composite layer comprising a plurality of sub-layers formed of different materials. In some embodiments, the seed layer 238 comprises a titanium layer and a copper layer over the titanium layer. The seed layer 238 may be formed using, for example, PVD or the like.

A photo resist 240 is formed and patterned on the seed layer 238. The photo resist 240 may be formed by spin coating or the like and may be exposed to light for patterning. The pattern of the photo resist 240 corresponds to a metallization pattern. The patterning forms openings through the photo resist 240 to expose the seed layer 238.

A conductive material 242 is formed in the openings of the photo resist 240 and on the exposed portions of the seed layer 238. The conductive material 242 may be formed by plating, such as electroplating or electroless plating, or the like. The conductive material 242 may comprise a conductive material, such as a metal, like copper, titanium, tungsten, aluminum, or the like.

Figure 21:
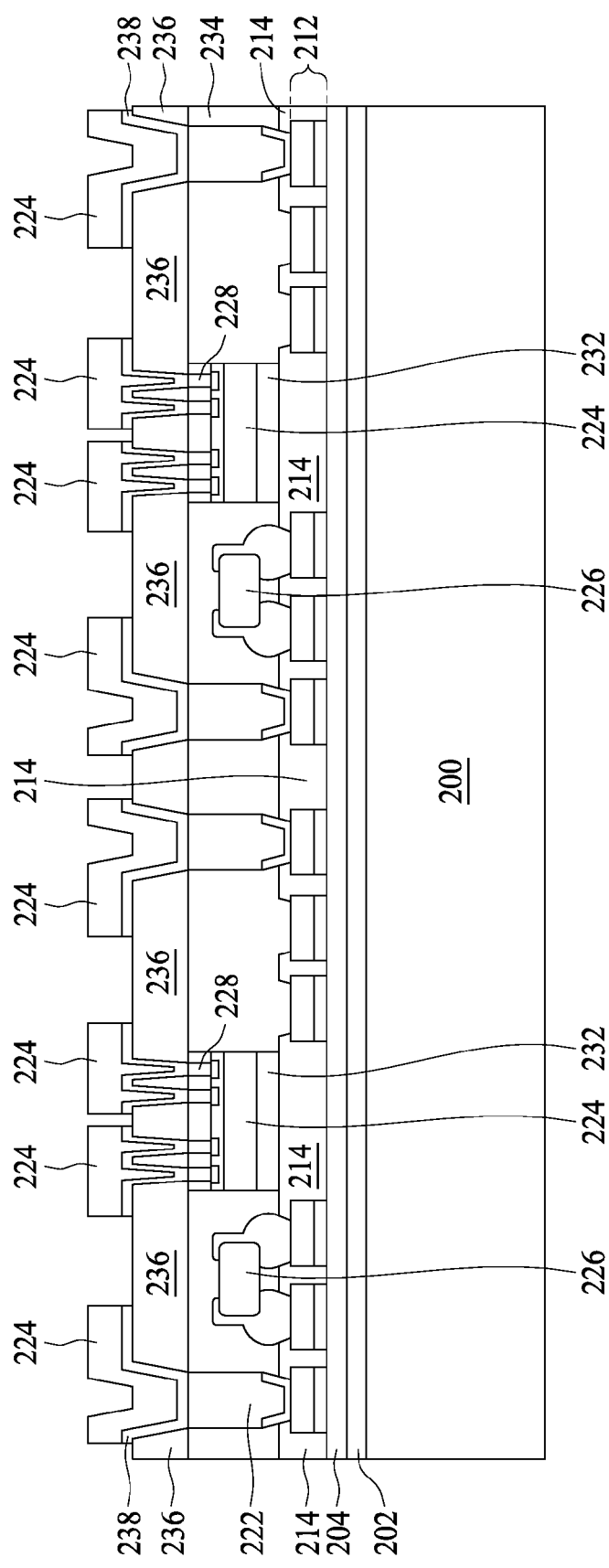

In FIG. 21, the photo resist 240 and portions of the seed layer 238 on which the conductive material 242 is not formed are removed. The photo resist 240 may be removed by an acceptable ashing or stripping process, such as using an oxygen plasma or the like. Once the photo resist 240 is removed, exposed portions of the seed layer 238 are removed, such as by using an acceptable etching process, such as by wet or dry etching. The remaining portions of the seed layer 238 and conductive material 242 form a metallization pattern 244.

Figure 22:
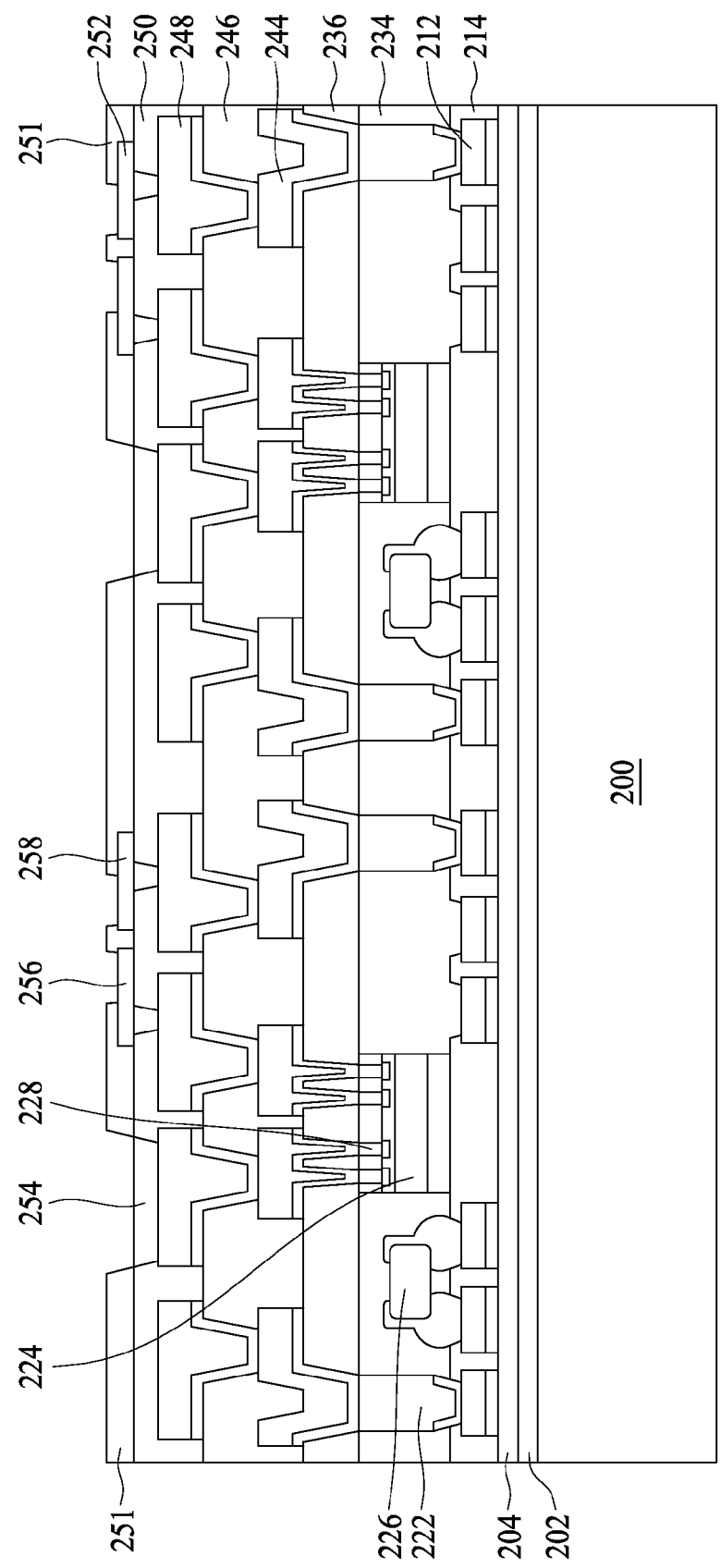

In FIG. 22, dielectric layers 246 and 250 and metallization patterns 248 and 252 are formed by repeating processes discussed above with respect to FIGS. 19 through 21. In some embodiments, these additional dielectric layers and metallization patterns are omitted, while in other embodiments, more or less dielectric layers and metallization patterns may be formed. As illustrated in FIG. 22, the metallization pattern 252 includes under-metal 254 and pads 256 and 258. Further, similar to the process discussed with respect to FIG. 19, a dielectric layer 251 is formed on the metallization pattern 252 and dielectric layer 250. The dielectric layer 251 is patterned to expose under-metal 254 and pads 256 and 258 in the metallization pattern 252.

Figure 23:
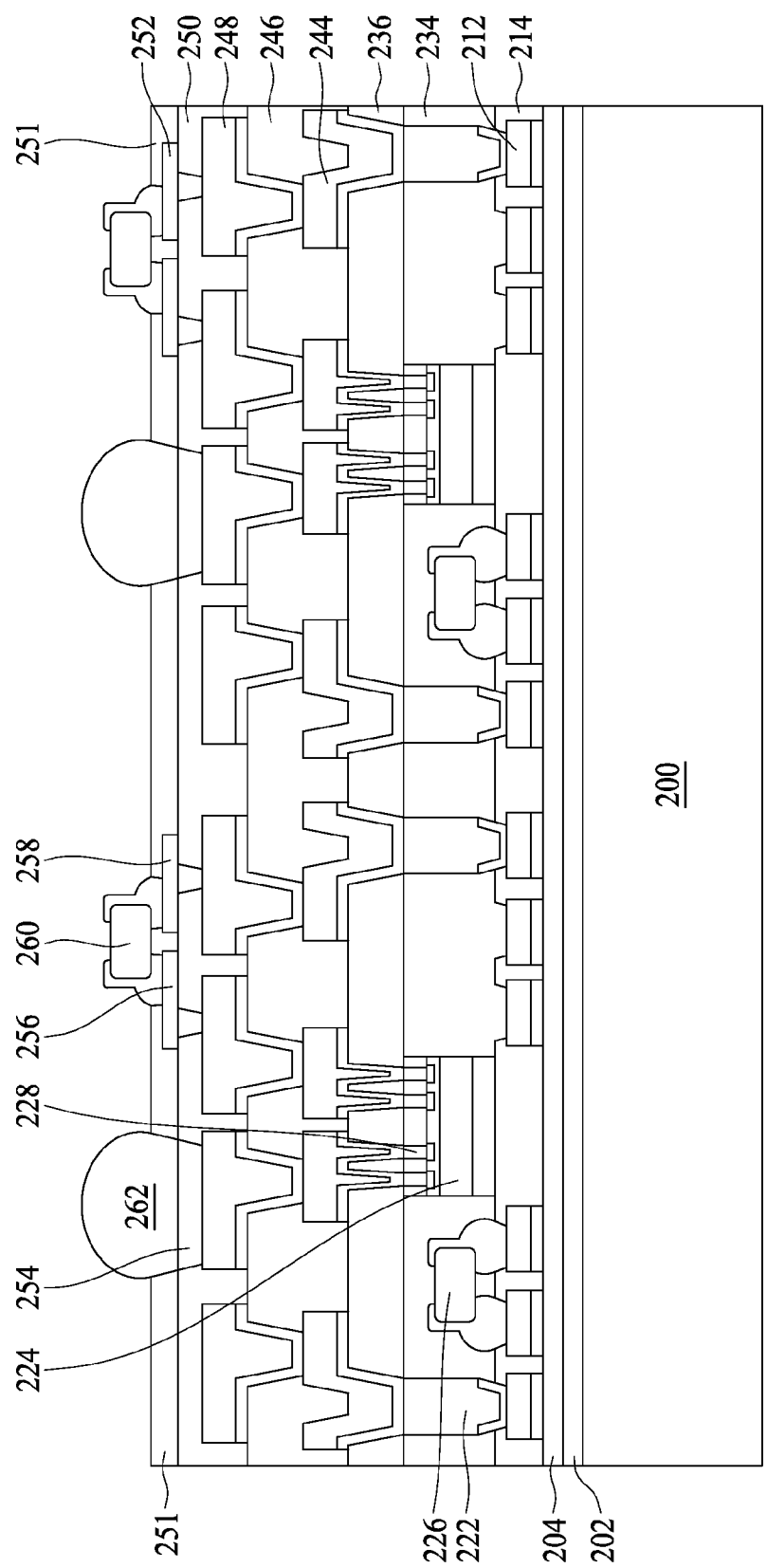

In FIG. 23, SMD/IPDs 260 are connected between pads 256 and 258 of the metallization pattern 252. The SMD/IPDs 260 may be connected to the pads 256 and 258 of the metallization pattern 252 using, for example, a pick-and-place tool, and bonding the SMD/IPDs 260 to the pads 256 and 258 by metal-to-metal bonding, solder reflowing, or the like. In some embodiments, the SMD/IPDs 260 are low resistance resistors, such as having a resistance less than about 0.1 ohms, and more specifically, less than about 0.05 ohms. In other embodiments, other components, such as a wire bond or other acceptable jumper, may be used as an anti-fuse between the pads 256 and 258 of the metallization pattern 252. When a wire bond is used, any acceptable wire bonding technique may be used to form the wire bond on the exposed portions of the metallization pattern. One of ordinary skill in the art will readily understand other appropriate techniques for forming other jumpers.

External connectors 262, such as solder balls like ball grid array (BGA) balls, are formed on the under-metal 254, such as by using an appropriate ball drop process. In some embodiments, the external connectors 262 comprise solder, such as a Sn—Ag alloy, a Sn—Ag—Cu alloy, or the like, and may be lead-free or lead-containing.

Figure 24:
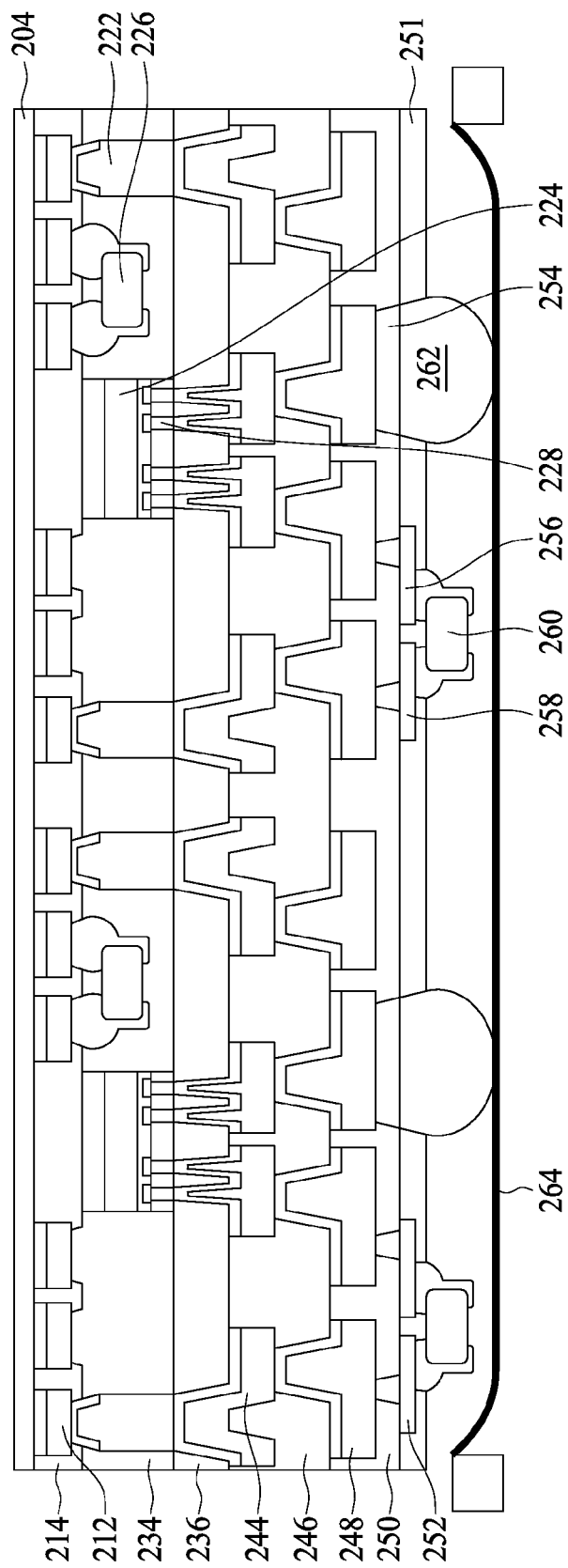

In FIG. 24, a carrier de-bonding is performed to detach (de-bond) carrier 200 from the overlying structure. In accordance with some embodiments, the de-bonding includes projecting a light such as a laser light or an UV light on release layer 202 so that release layer 202 decomposes under the heat of the light and carrier 200 can be removed. The structure is then flipped over and placed on a dicing tape 264.

Figure 25:
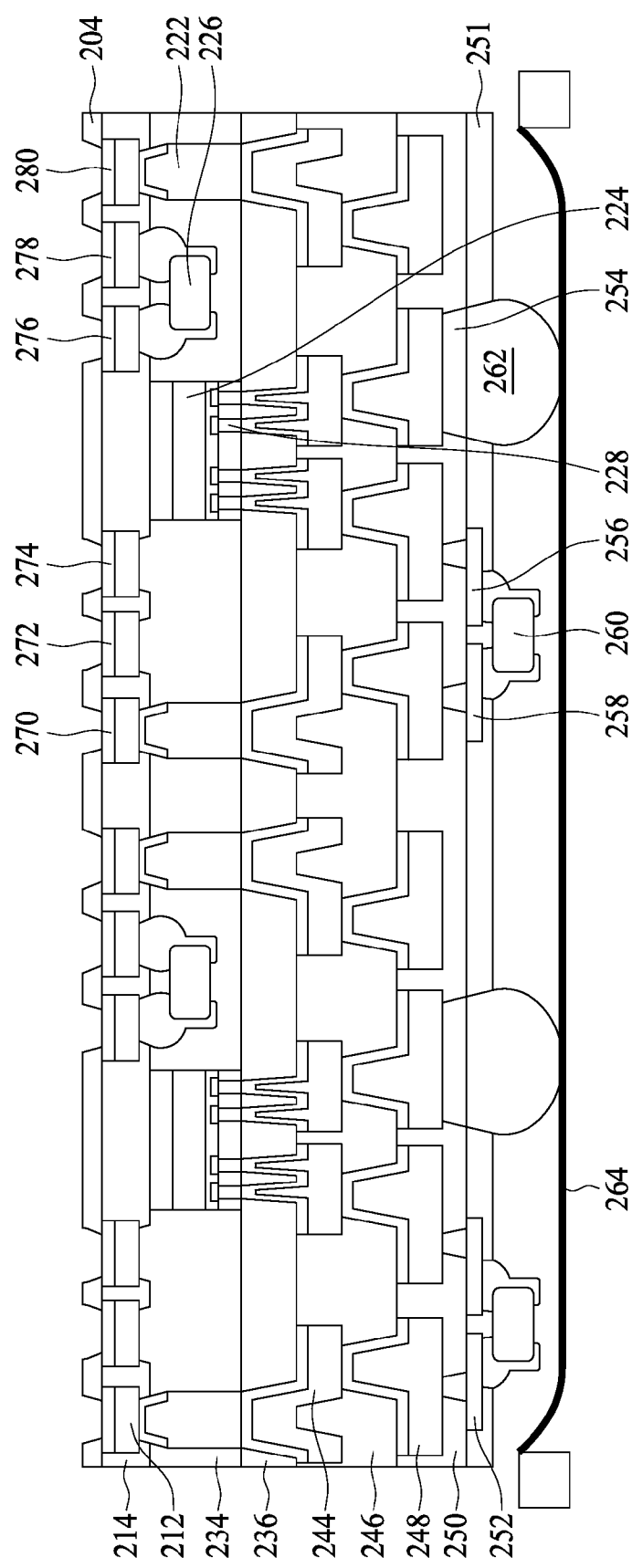

In FIG. 25, openings are formed through the dielectric layer 204 to expose portions of the metallization pattern 212. The exposed portions of the metallization pattern 212 form pads 270, 272, 274, 276, 278, and 280. The openings may be formed, for example, using laser drilling, etching, or the like.

Figure 26:
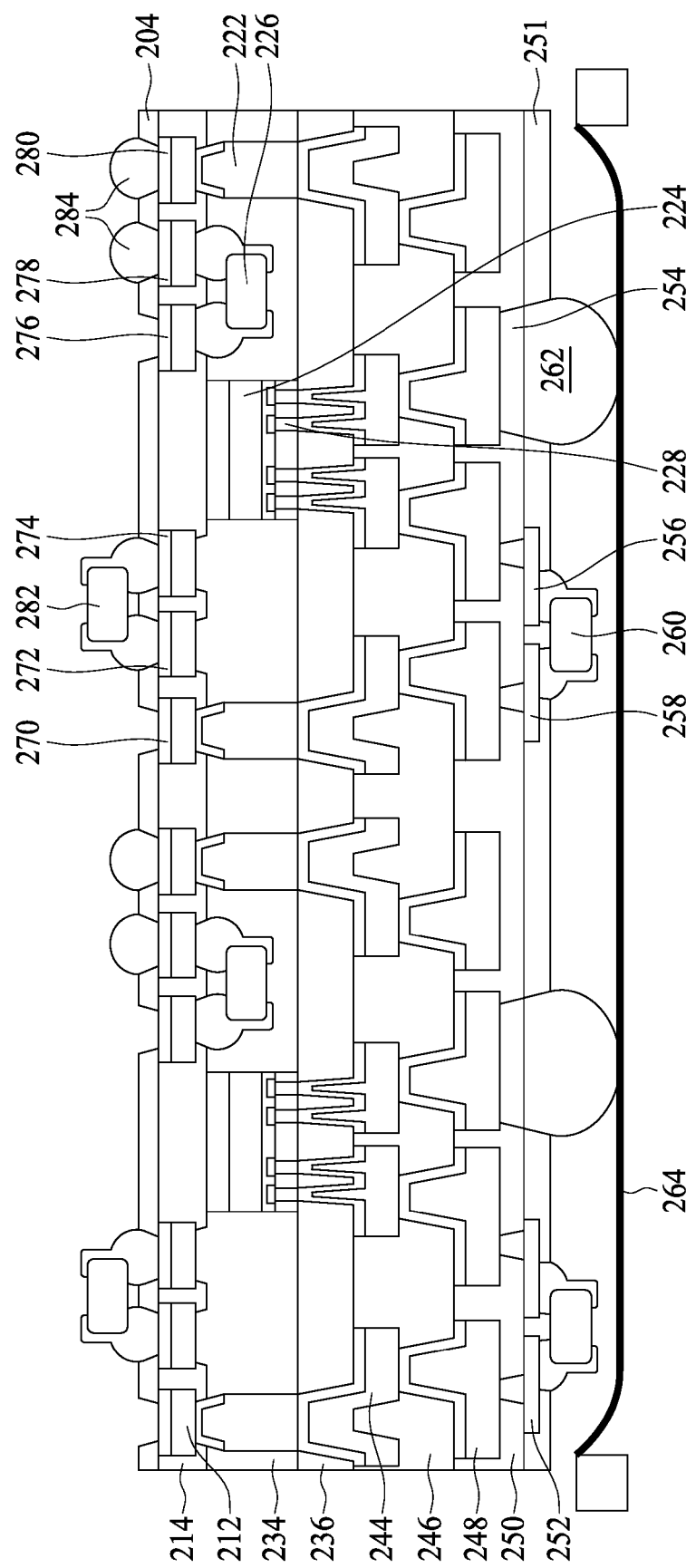

In FIG. 26, SMD/IPDs 282 are connected between pads 272 and 274 of the metallization pattern 212. The SMD/IPDs 282 may be connected to the pads 272 and 274 of the metallization pattern 212 using, for example, a pick-and-place tool, and bonding the SMD/IPDs 282 to the pads 272 and 274 by metal-to-metal bonding, solder reflowing, or the like. In some embodiments, the SMD/IPDs 282 are low resistance resistors, such as having a resistance less than about 0.1 ohms, and more specifically, less than about 0.05 ohms. In other embodiments, other components, such as a wire bond or other acceptable jumper, may be used as an anti-fuse between the pads 272 and 274 of the metallization pattern 212. When a wire bond is used, any acceptable wire bonding technique may be used to form the wire bond on the exposed portions of the metallization pattern. One of ordinary skill in the art will readily understand other appropriate techniques for forming other jumpers.

External connectors 284, such as solder bumps, metal pillars, the like, or a combination such as metal pillars with solder thereon, are formed on the pads 278 and 280 of the metallization pattern 212, such as by using an appropriate bumping process, plating process, the like, or a combination thereof. In some embodiments, the external connectors 284 comprise solder, such as a Sn—Ag alloy, a Sn—Ag—Cu alloy, or the like, and may be lead-free or lead-containing.

The foregoing process illustrated in FIGS. 10 through 26 illustrates various placements of SMD/IPDs 226, 260, and 282 in unsingulated packages. In other embodiments, SMD/IPDs 226, 260, and 282 may be placed in fewer or more locations within a package. The foregoing figures merely illustrate example locations where an SMD/IPD may be located. Further, other jumpers, such as wire bonds or the like, may be used in combination with or in the place of SMD/IPDs. A person of ordinary skill in the art will readily understand these modifications.

Figure 27:
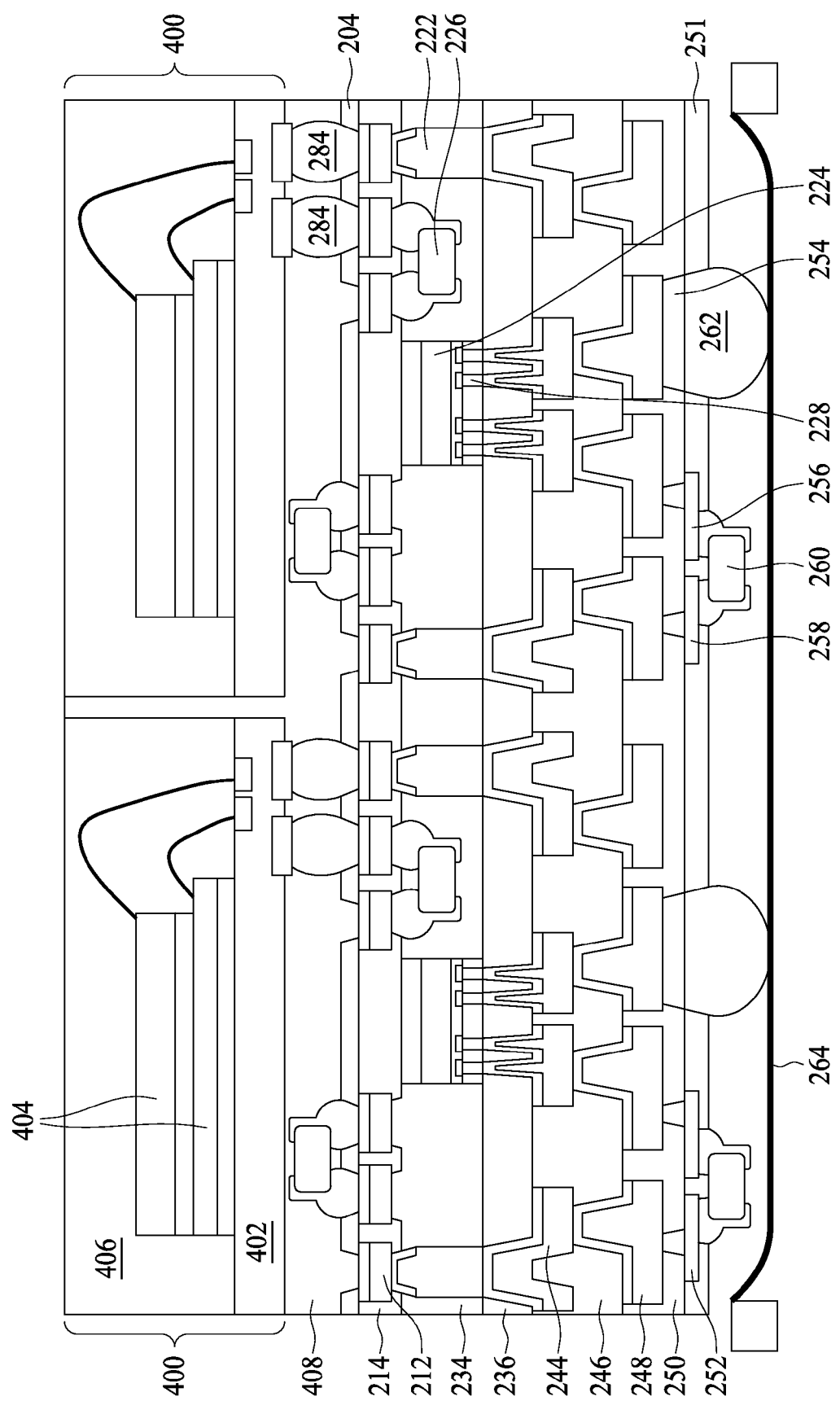

In FIG. 27, packages 400 are attached to respective ones of unsingulated packages formed in FIGS. 10 through 26. The packages 400 may be any packages, and as illustrated, each generally comprises a substrate 402, which may be an interposer, on which dies 404 are adhered. The dies 404 are electrically coupled to the substrate 402 by wire bonding. The dies 404 are further encapsulated on the substrate 402 by an encapsulant 406, which may be a molding compound, epoxy, or the like. The packages 400 can be attached to the unsingulated packages using, for example, a pick-and-place tool and reflowing the external connectors 284. An underfill material 408 is then dispensed between the packages 400 and the unsingulated packages to surround the components, such as SMD/IPDs 282 and external connectors 284, formed between the packages 400 and the unsingluated packages. The underfill material 408 is then cured.

Figure 28:
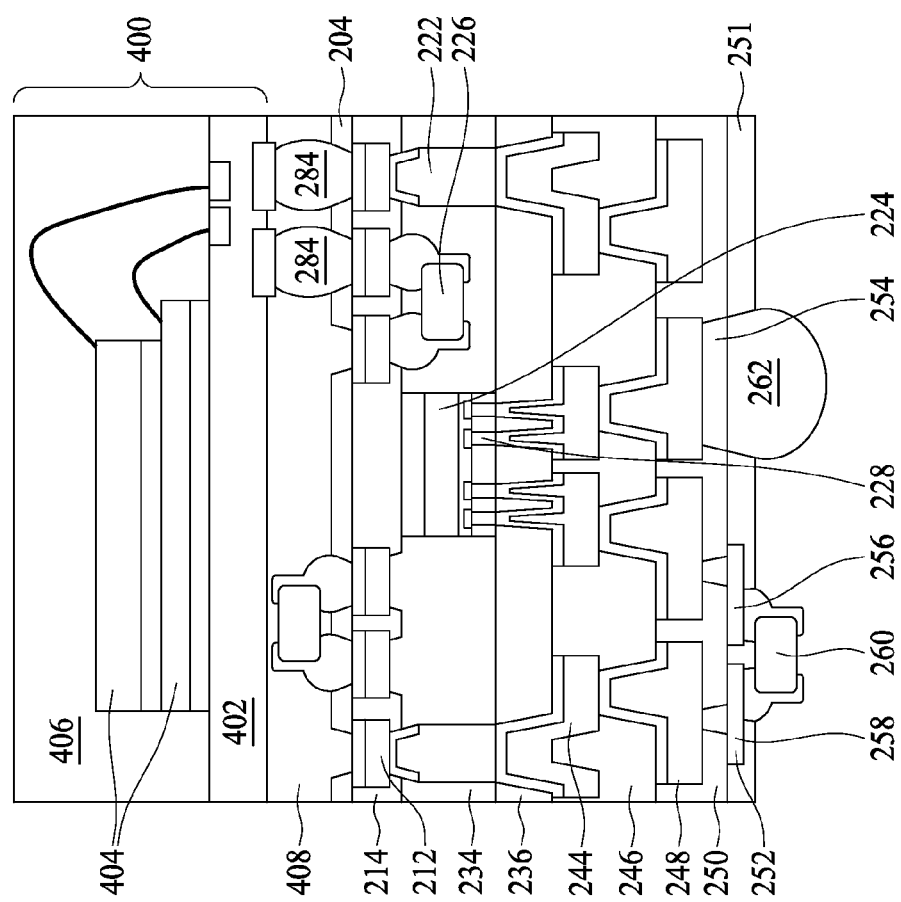
Figure 29:
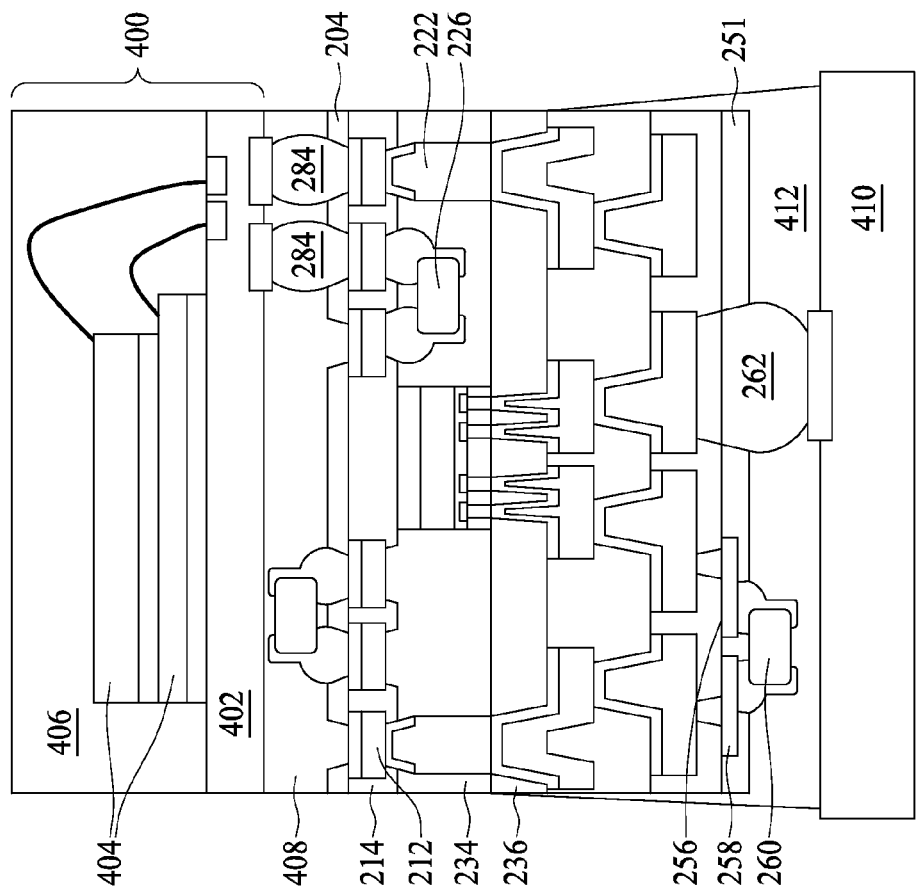

FIG. 28 illustrates a package-on-package structure after singulation, such as by dicing or sawing. The package-on-package structure includes a package 401, which is generally formed by the process in FIGS. 10 through 26, and includes the package 400. In FIG. 29, the package-on-package structure is attached to a substrate 410, such as a PCB, by external connectors 262, which may be reflowed to attach the substrate 410. An underfill material 412 is then dispensed between the package 401 and the substrate 410 to surround the components, such as SMD/IPDs 260 and external connectors 262, formed between the package 401 and the substrate 410. The underfill material 412 is then cured.

Figure 30A:
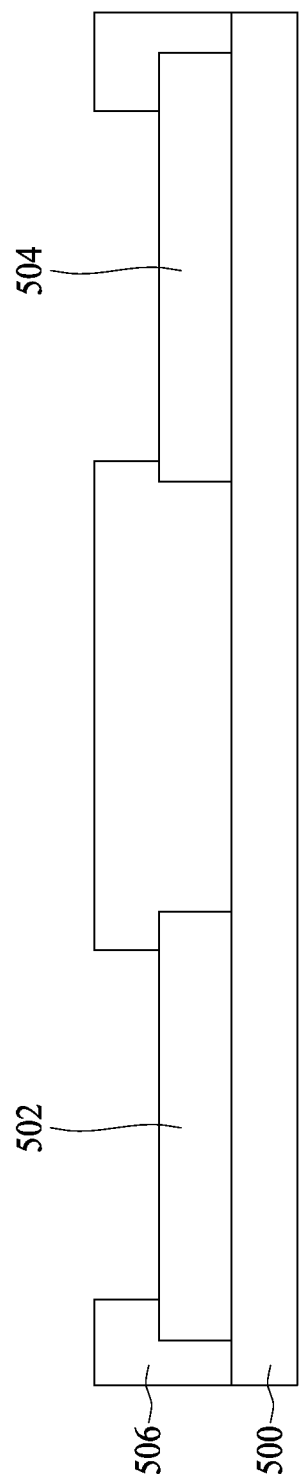
FIGS. 30A through 30D are cross sectional views of intermediate steps during a process for attaching a surface mount device (SMD) of integrated passive device (IPD) (hereinafter "SMD/IPD") in accordance with some embodiments.
Figure 30B:
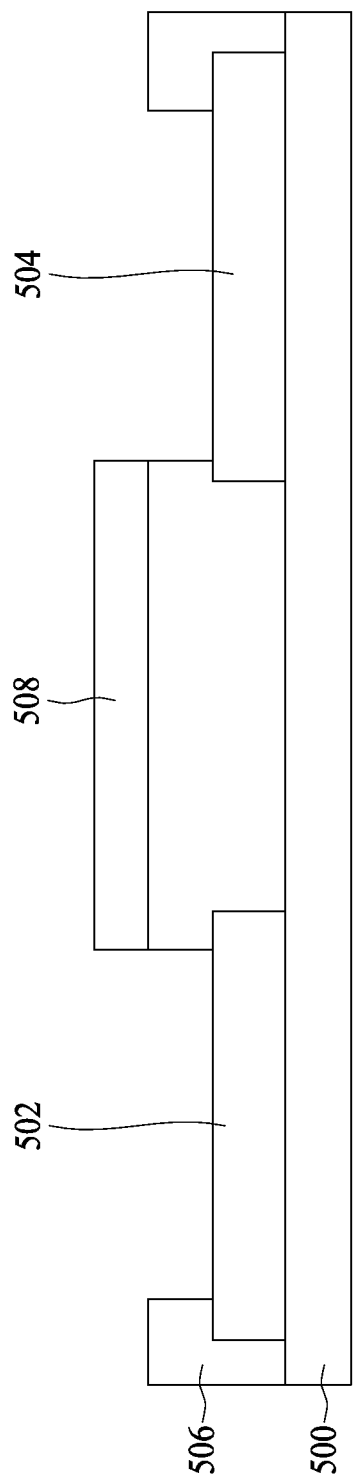
Figure 30C:
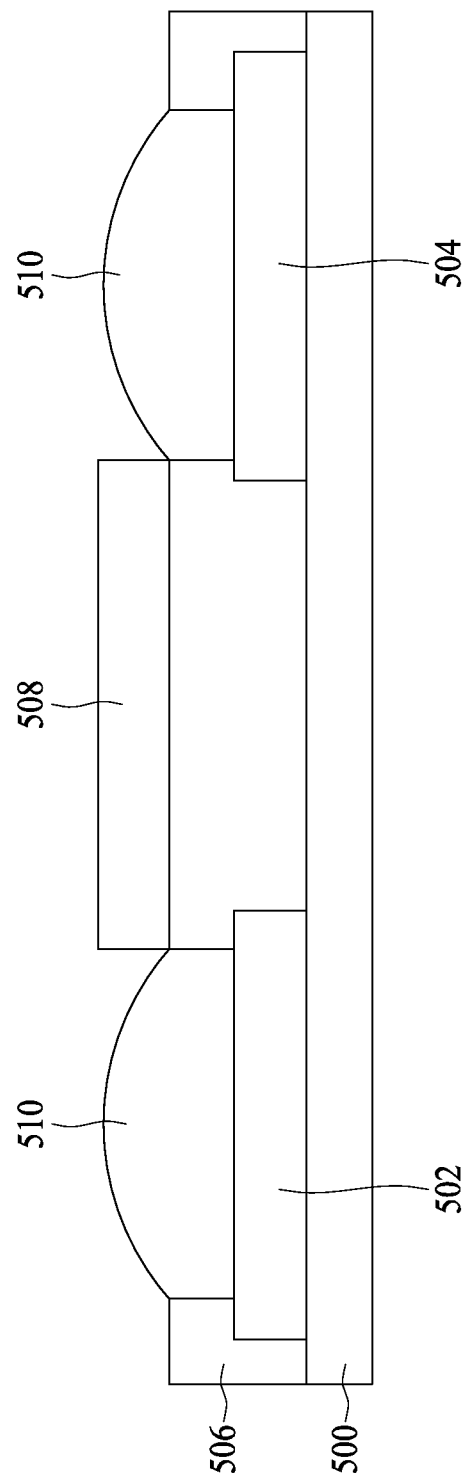
Figure 30D:
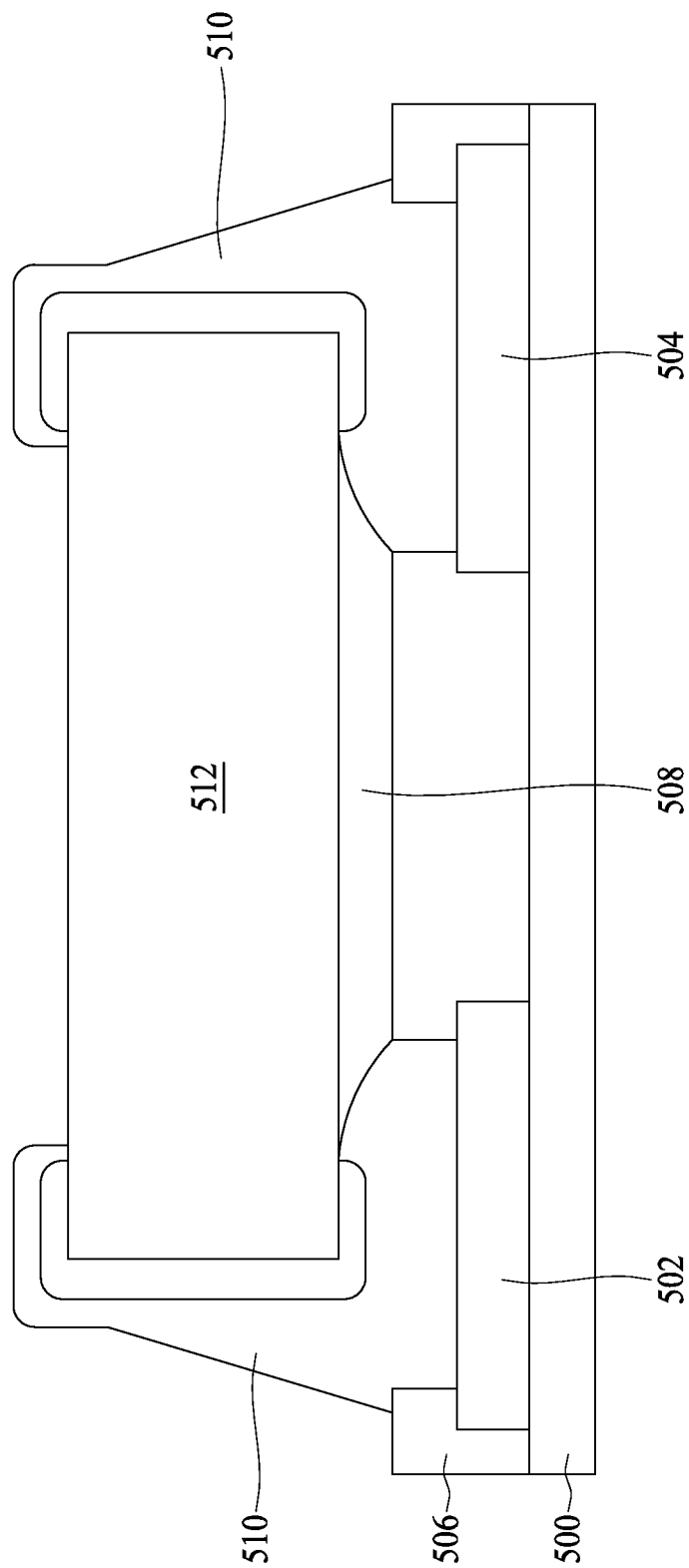

FIGS. 30A through 30D generally illustrate aspects of embodiments for attaching an SMD/IPD. One having ordinary skill in the art will readily understand how these aspects apply to the process discussed above with respect to FIGS. 10 through 29. In FIG. 30A, pads 502 and 504, which may be part of a metallization pattern, are formed on a dielectric layer 500. The dielectric layer 506 is then formed on the dielectric layer 500 and the pads 502 and 504. The dielectric layer 506 is then patterned to form openings to expose portions of the pads 502 and 504. The patterning may be by an acceptable process, such as by exposing the dielectric layer 214 to light when the dielectric layer is a photosensitive material, by etching using, for example, an anisotropic etch, by laser-drilling, or the like. In FIG. 30B, a spacer material 508, such as the spacer material 310 in FIG. 3, is formed on the dielectric layer 506 between the pads 502 and 504, which may be by printing, jetting, or the like. In FIG. 30C, solder 510 is formed on the pads 502 and 504, which may be by any acceptable process, such as printing, plating, or the like. In FIG. 30D, an SMD/IPD 512 is contacted to the solder 510, and the solder 510 is reflowed to attach the SMD/IPD 512. The SMD/IPD 512 may contact the spacer material 508.

Figure 31:
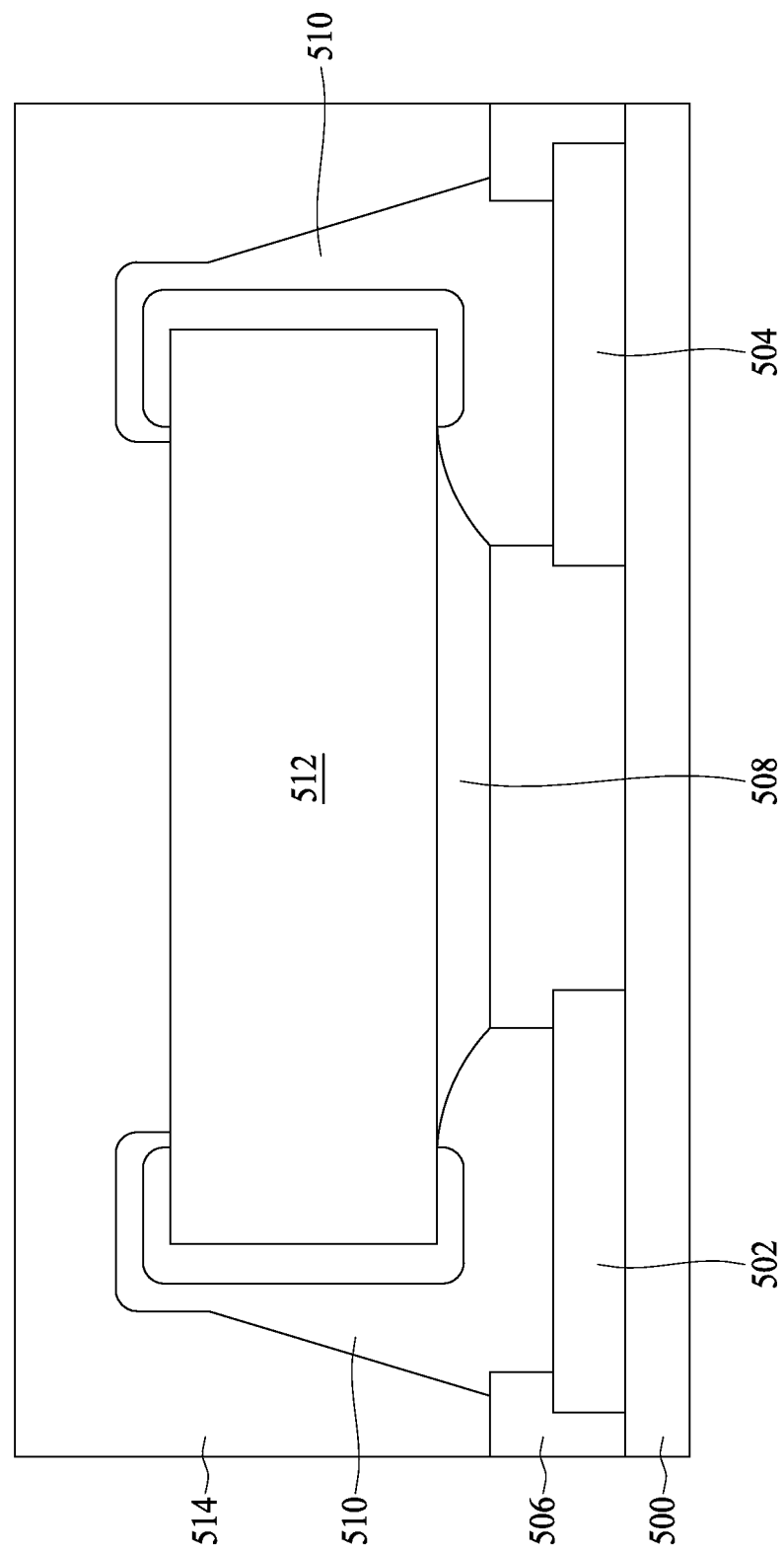
FIGS. 31, 32A, and 32B are cross sectional views of intermediate steps during processes for encapsulating a SMD/IPD in accordance with some embodiments.
Figure 32A:
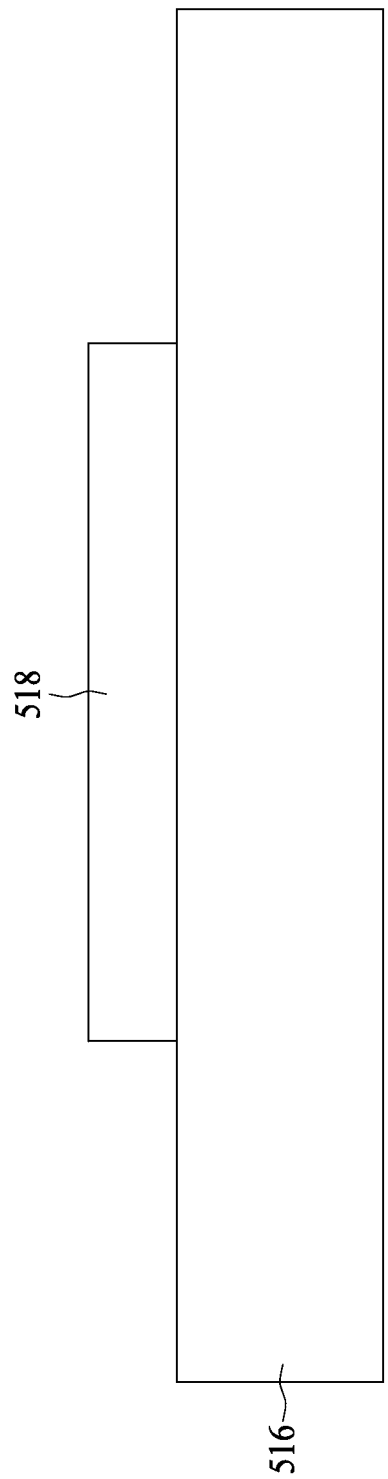
Figure 32B:
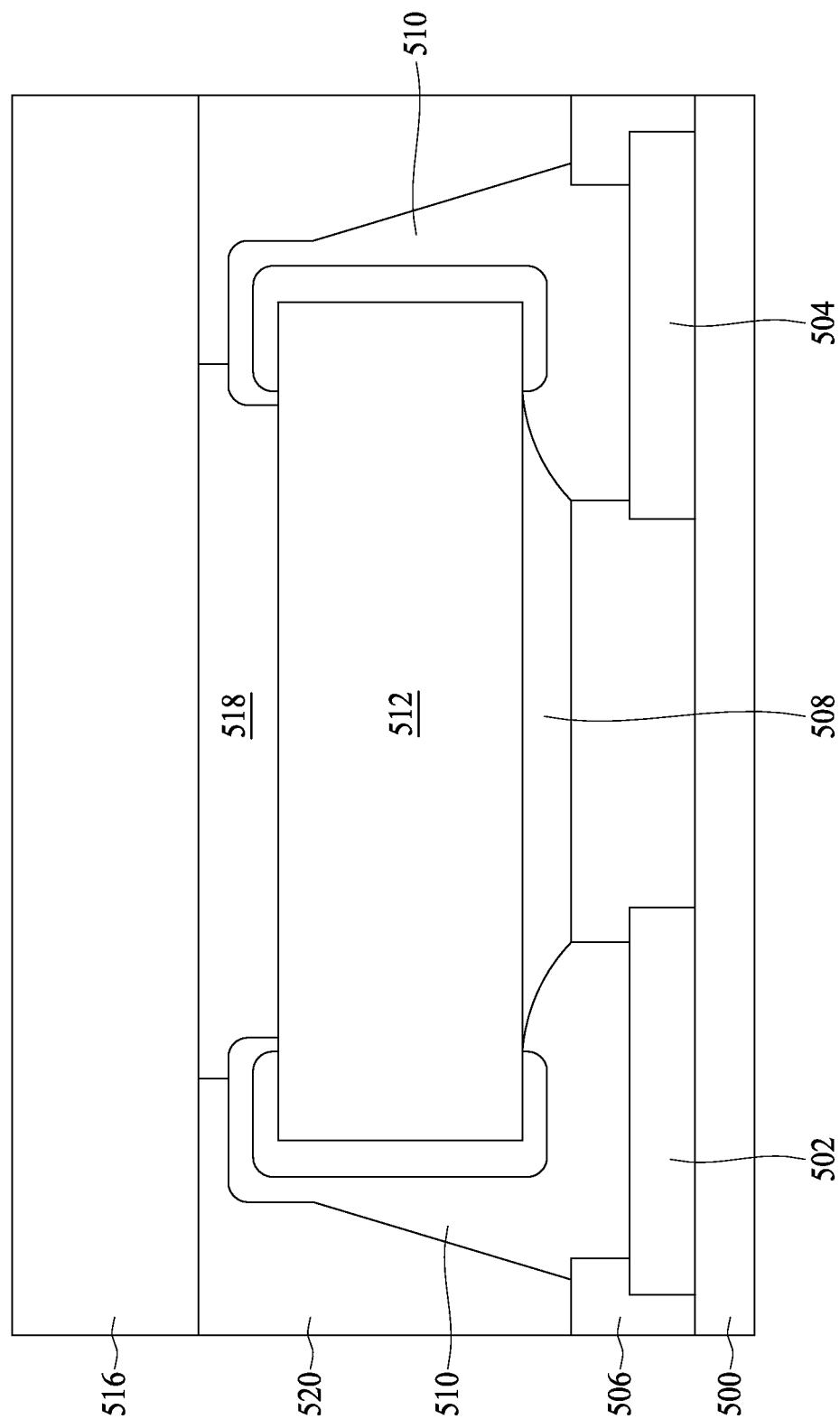

In some embodiments, as illustrated in FIG. 31, the SMD/IPD 512 is then encapsulated with an encapsulant 514, which may be an underfill material, a molding compound, epoxy, or the like. The encapsulant 514 can be a different material composition from a material composition of the spacer material 508. In other embodiments, as illustrated in FIGS. 32A and 32B, another spacer material 518 can be formed on a substrate 516 that will oppose the SMD/IPD 512. In FIG. 32A, a spacer material 518, such as the spacer material 328 in FIG. 5, is formed on an area of the substrate 516, which may be by printing, jetting, or the like. In FIG. 32B, the substrate 516 is attached to the package on which the SMD/IPD 512 is attached, such as by reflowing external connectors (not illustrated). An underfill material 520 can then be dispensed and cured between the substrate 516 and the dielectric layer 506 and around the SMD/IPD 512. The spacer material 518 may contact the SMD/IPD 512. The underfill material 520 can be a different material composition from a material composition of one or both of the spacer material 508 and the spacer material 518.

The processes in FIGS. 30A through 30D and 31 may be applied to the SMD/IPD 226 discussed above. In such circumstances, the dielectric layer 500 corresponds to dielectric layer 204; pads 502 and 504 are in metallization pattern 212; and the dielectric layer 506 corresponds to dielectric layer 214. The forming and patterning of the dielectric layer 506 shown in FIG. 30A corresponds to the forming and patterning of the dielectric layer 214 in FIG. 13. The processing in FIGS. 30B through 30D corresponds to processing that occurs with respect to FIG. 16. The encapsulant 514 in FIG. 31 corresponds to encapsulant 234 formed in FIG. 17.

The processes in FIGS. 30A through 30D, 31 and 32A through 32B may be applied to the SMD/IPD 260 discussed above. In such circumstances, the dielectric layer 500 corresponds to dielectric layer 250; pads 502 and 504 correspond to pads 256 and 258 in metallization pattern 252; and the dielectric layer 506 corresponds to dielectric layer 251.

The forming and patterning of the dielectric layer 506 shown in FIG. 30A corresponds to the forming and patterning of the dielectric layer 251 in FIG. 22. The processing in FIGS. 30B through 30D corresponds to processing that occurs with respect to FIG. 23. The encapsulant 514 in FIG. 31 corresponds to underfill material 412 formed in FIG. 29. The spacer material 518 in FIG. 32A can be formed on the substrate 410 before the substrate 410 is attached to the package 401, and the attaching the substrate 516 in FIG. 32B corresponds to the attaching the substrate 410 to the package 401 in FIG. 29.

The processes in FIGS. 30A through 30D, 31 and 32A through 32B may be applied to the SMD/IPD 282 discussed above. In such circumstances, the dielectric layer 500 corresponds to dielectric layer 214; pads 502 and 504 correspond to pads 272 and 274 in metallization pattern 212; and the dielectric layer 506 corresponds to dielectric layer 204. The forming of the dielectric layer 506 shown in FIG. 30A corresponds to the forming of the dielectric layer 204 in FIG. 10, and the patterning of the dielectric layer 506 shown in FIG. 30A corresponds to the patterning of the dielectric layer 204 in FIG. 25. The processing in FIGS. 30B through 30D corresponds to processing that occurs with respect to FIG. 26. The encapsulant 514 in FIG. 31 corresponds to underfill material 408 formed in FIG. 27. The spacer material 518 in FIG. 32A can be formed on the substrate 402 before the package 400 is attached to the package 401, and the attaching the substrate 516 in FIG. 32B corresponds to the attaching the package 400 to the unsingulated package in FIG. 27.

Figure 33A:
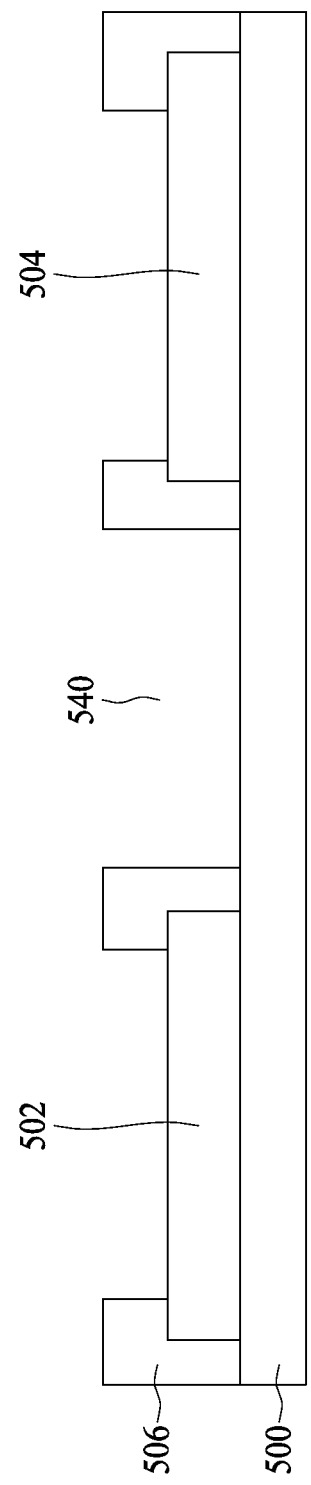
FIGS. 33A through 33D are cross sectional views of intermediate steps during a process for attaching a SMD/IPD in accordance with some embodiments.
Figure 33B:
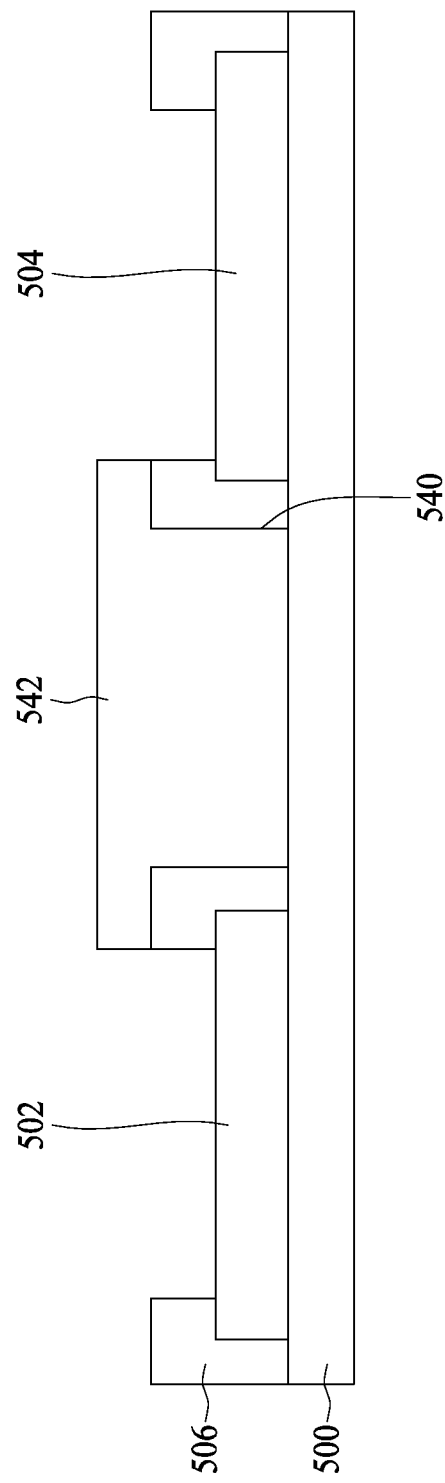
Figure 33C:
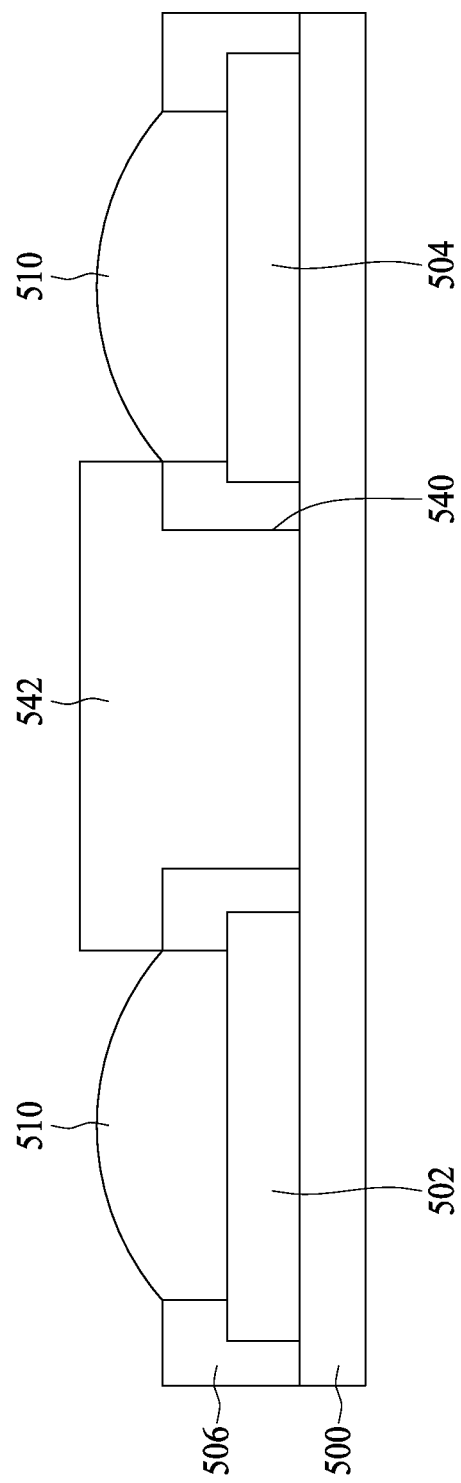
Figure 33D:
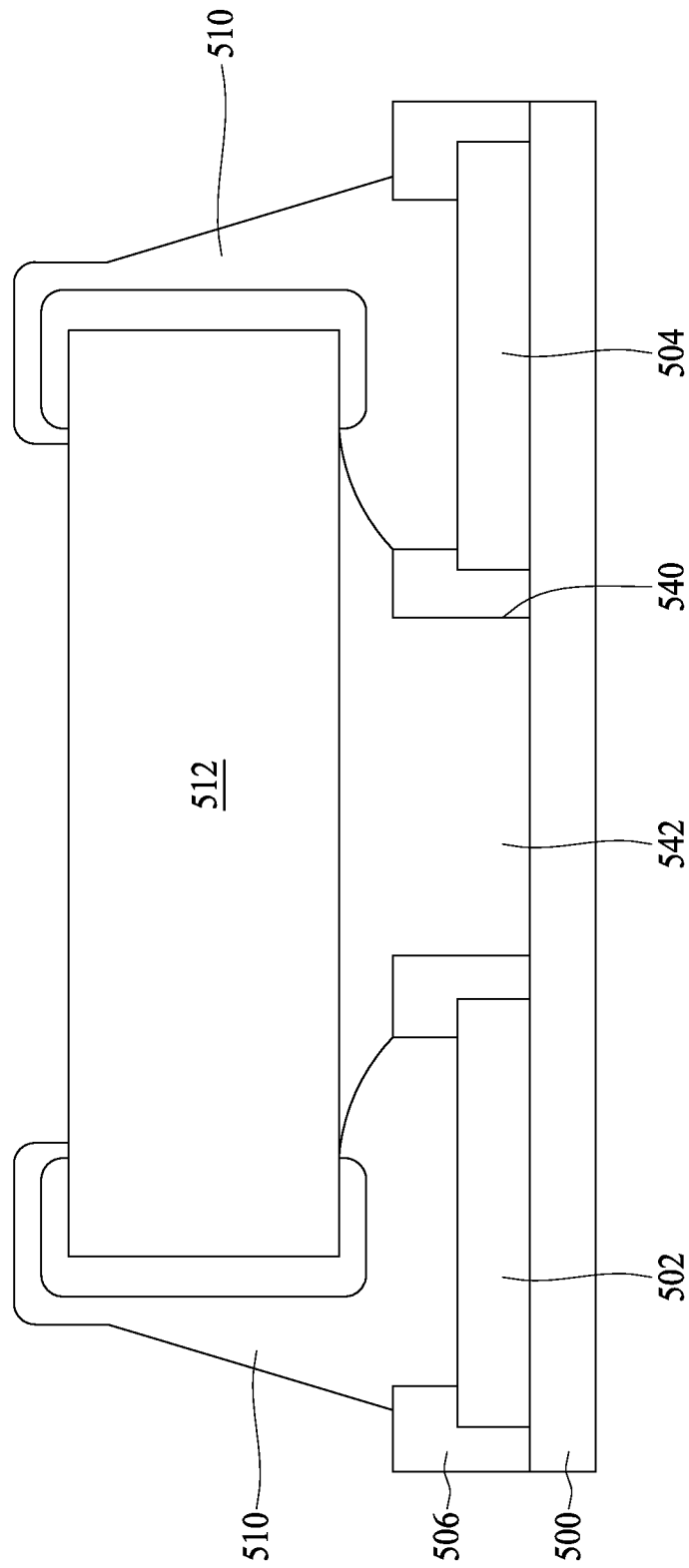

FIGS. 33A through 33D generally illustrate aspects of embodiments for attaching an SMD/IPD similar to FIGS. 30A through 30D. One having ordinary skill in the art will readily understand how these aspects apply to the process discussed above with respect to FIGS. 10 through 29. Discussion of common components in FIGS. 30A through 30D is omitted herein for brevity. In FIG. 33A, the dielectric layer 506 is further patterned to form a gap 540 between the pads 502 and 504. In FIG. 33B, a spacer material 542, such as the spacer material 316 in FIG. 4A, is formed in the gap 540 and on the dielectric layer 506 between the pads 502 and 504, which may be by printing, jetting, or the like. In FIG. 30C, solder 510 is formed on the pads 502 and 504. In FIG. 30D, an SMD/IPD 512 is contacted to the solder 510, and the solder 510 is reflowed to attach the SMD/IPD 512. The SMD/IPD 512 may contact the spacer material 542.

Figure 34:
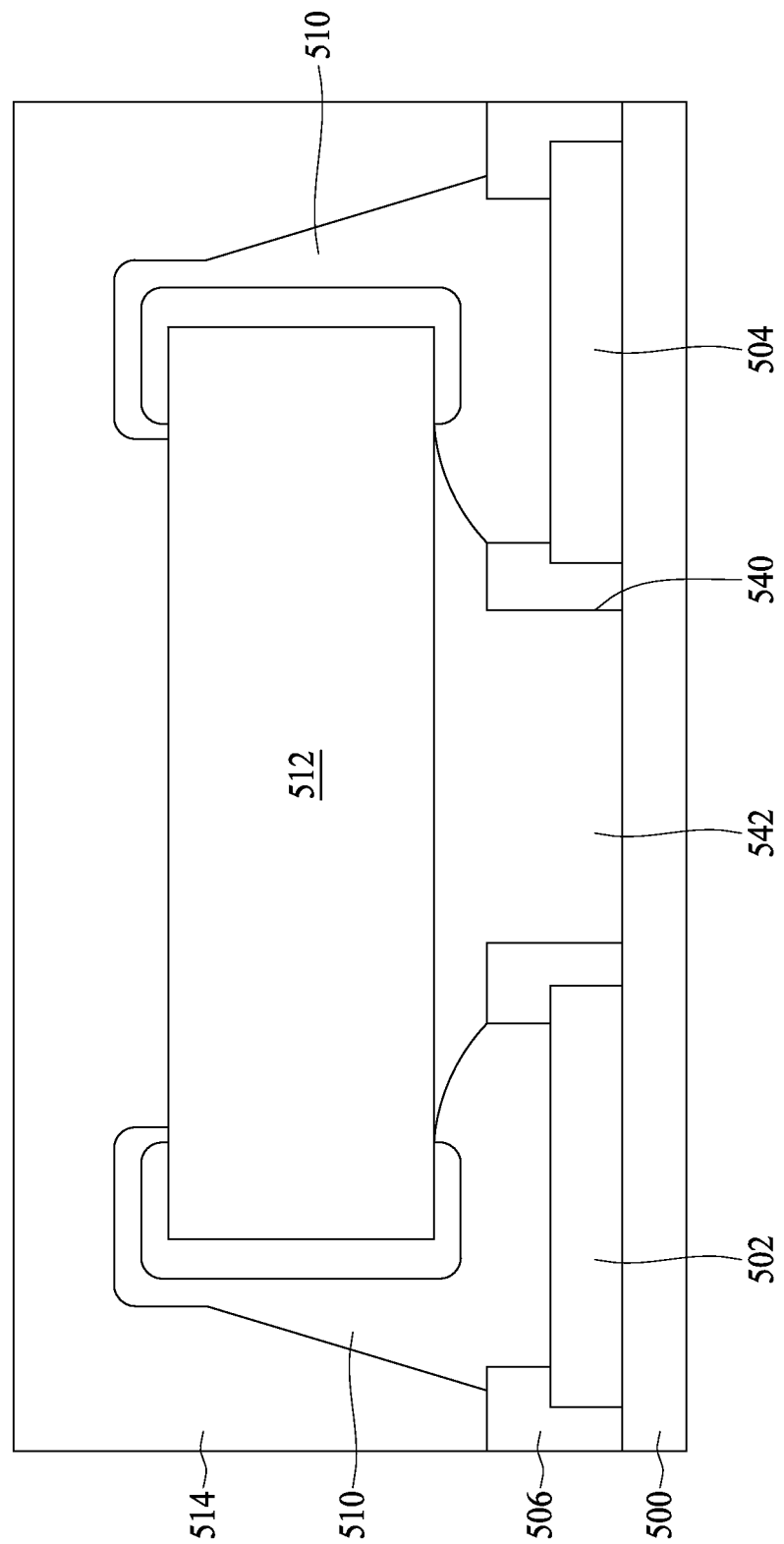
FIGS. 34, 35A, and 35B are cross sectional views of intermediate steps during processes for encapsulating a SMD/IPD in accordance with some embodiments.
Figure 35A:
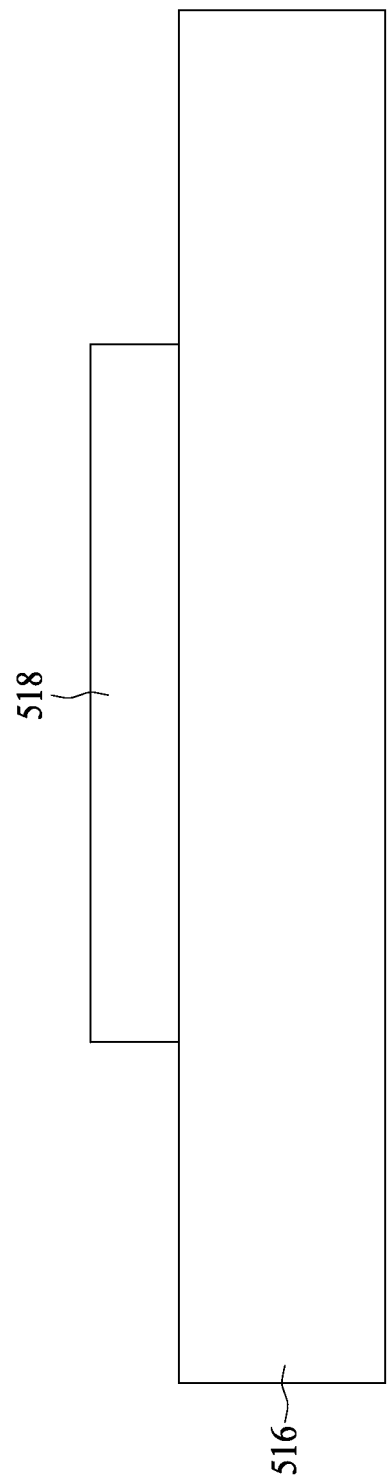
Figure 35B:
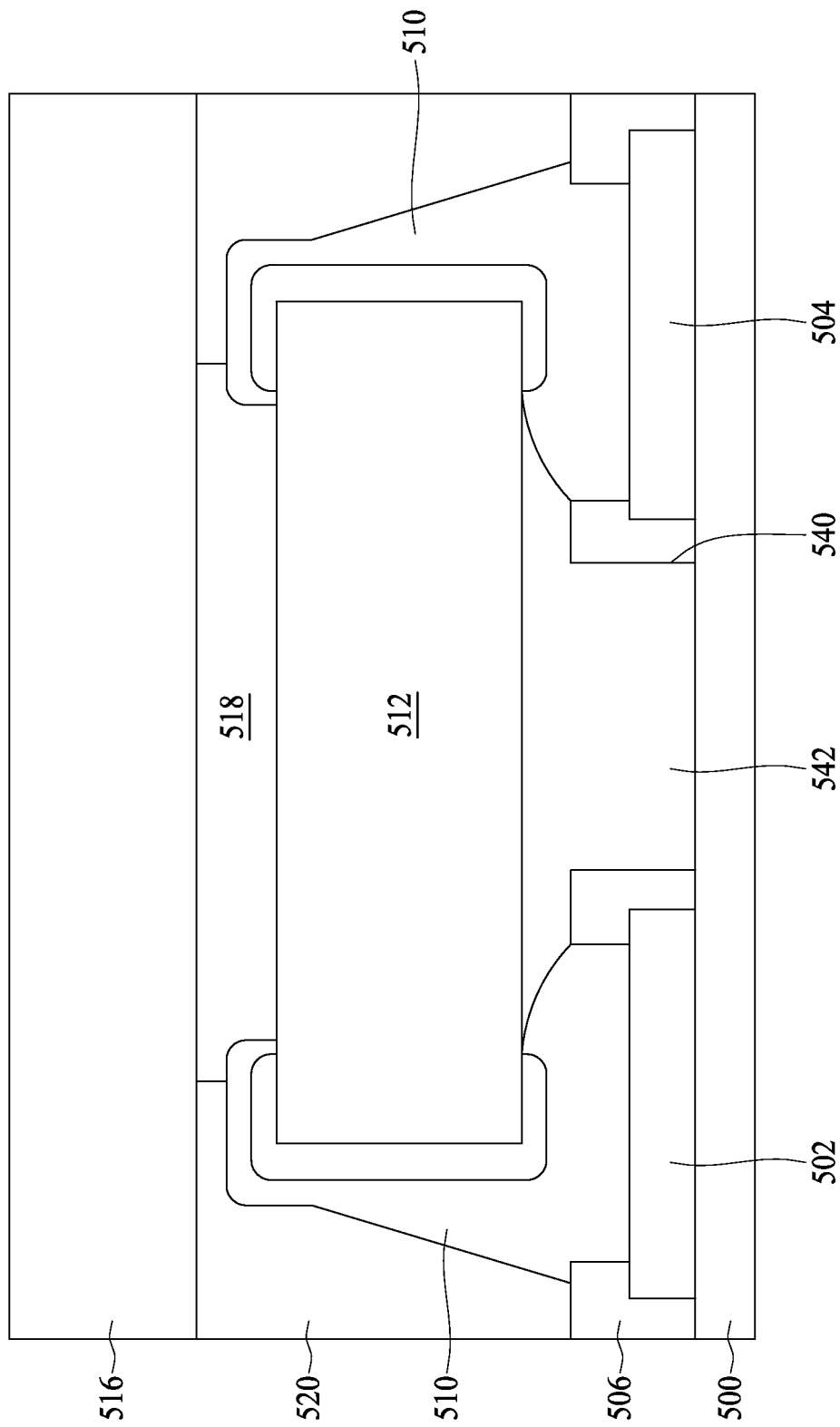

In some embodiments, as illustrated in FIG. 34, the SMD/IPD 512 is then encapsulated with an encapsulant 514, which may be an underfill material, a molding compound, or the like. The encapsulant 514 can be a different material composition from a material composition of the spacer material 542. In other embodiments, as illustrated in FIGS. 35A and 35B, another spacer material 518 can be formed on a substrate 516 that will oppose the SMD/IPD 512. In FIG. 35A, a spacer material 518, such as the spacer material 328 in FIG. 6, is formed on an area of the substrate 516, which may be by printing, jetting, or the like. In FIG. 35B, the substrate 516 is attached to the package on which the SMD/IPD 512 is attached, such as by reflowing external connectors (not illustrated). An underfill material 520 can then be dispensed and cured between the substrate 516 and the dielectric layer 506 and around the SMD/IPD 512. The spacer material 518 may contact the SMD/IPD 512. The underfill material 520 can be a different material composition from a material composition of one or both of the spacer material 542 and the spacer material 518.

The processes in FIGS. 33A through 33D, 34 and 35A through 35B may be applied to the SMD/IPDs 226, 260, and 282, similar to what was discussed above with respect to FIGS. 30A through 30D, 31 and 32A through 32B. One of ordinary skill in the art will readily understand that the respective dielectric layers 214, 251, and 204 can be patterned with the gap 540 during the patterning of those dielectric layers 214, 251, and 204 in FIGS. 13, 22, and 25, respectively, and that the spacer material 542 can be formed in the gap 540 during processing as discussed above for forming the spacer material 508.

Figure 36B:
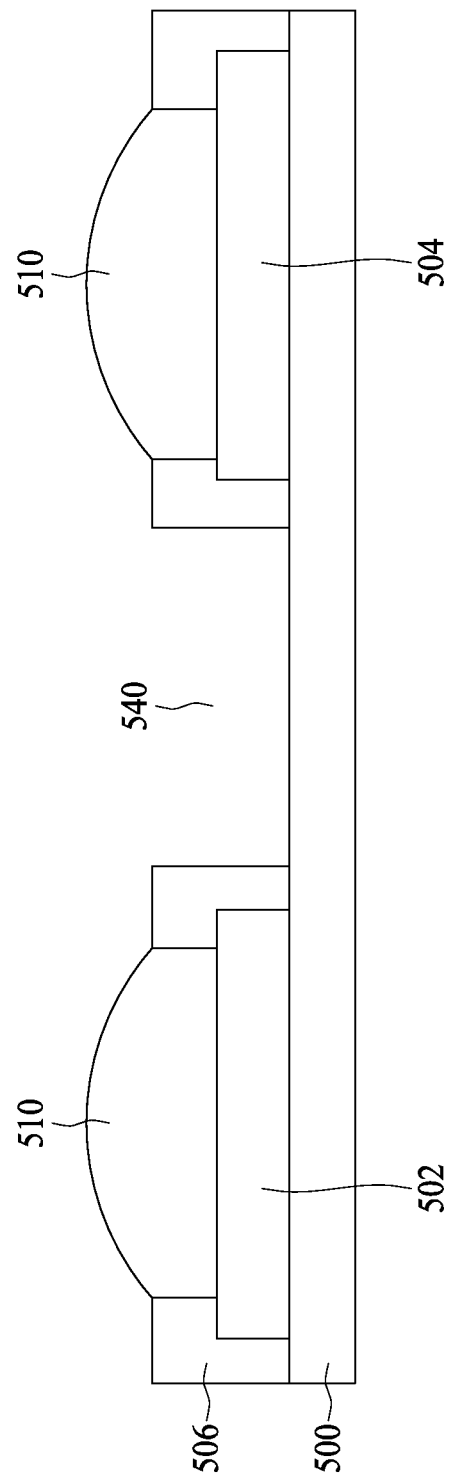
Figure 36C:
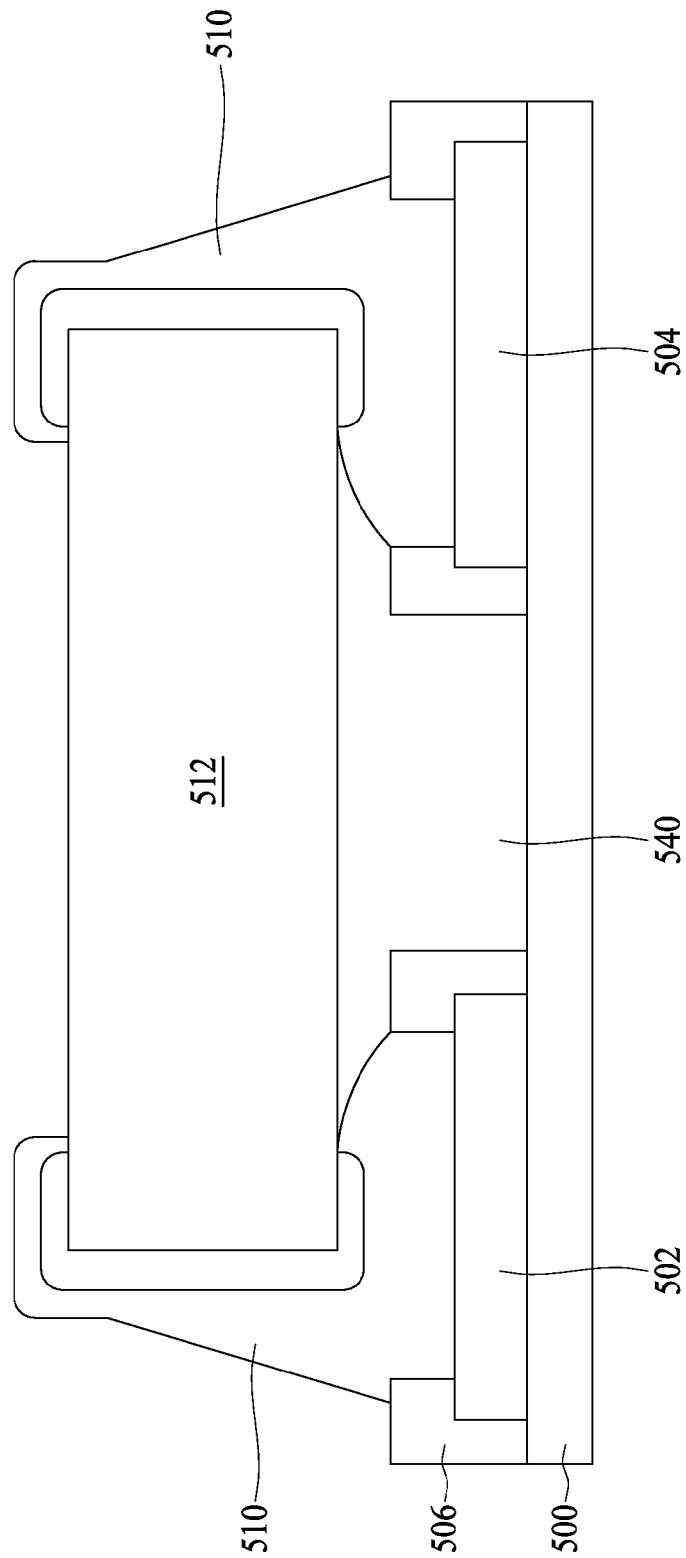

FIGS. 36A through 36C generally illustrate aspects of embodiments for attaching an SMD/IPD. One having ordinary skill in the art will readily understand how these aspects apply to the process discussed above with respect to FIGS. 10 through 29. Discussion of common components in FIGS. 30A through 30D is omitted herein for brevity. In FIG. 36A, the dielectric layer 506 is further patterned to form a gap 540 between the pads 502 and 504. In FIG. 36B, solder 510 is formed on the pads 502 and 504. In FIG. 36C, an SMD/IPD 512 is contacted to the solder 510, and the solder 510 is reflowed to attach the SMD/IPD 512.

Figure 37:
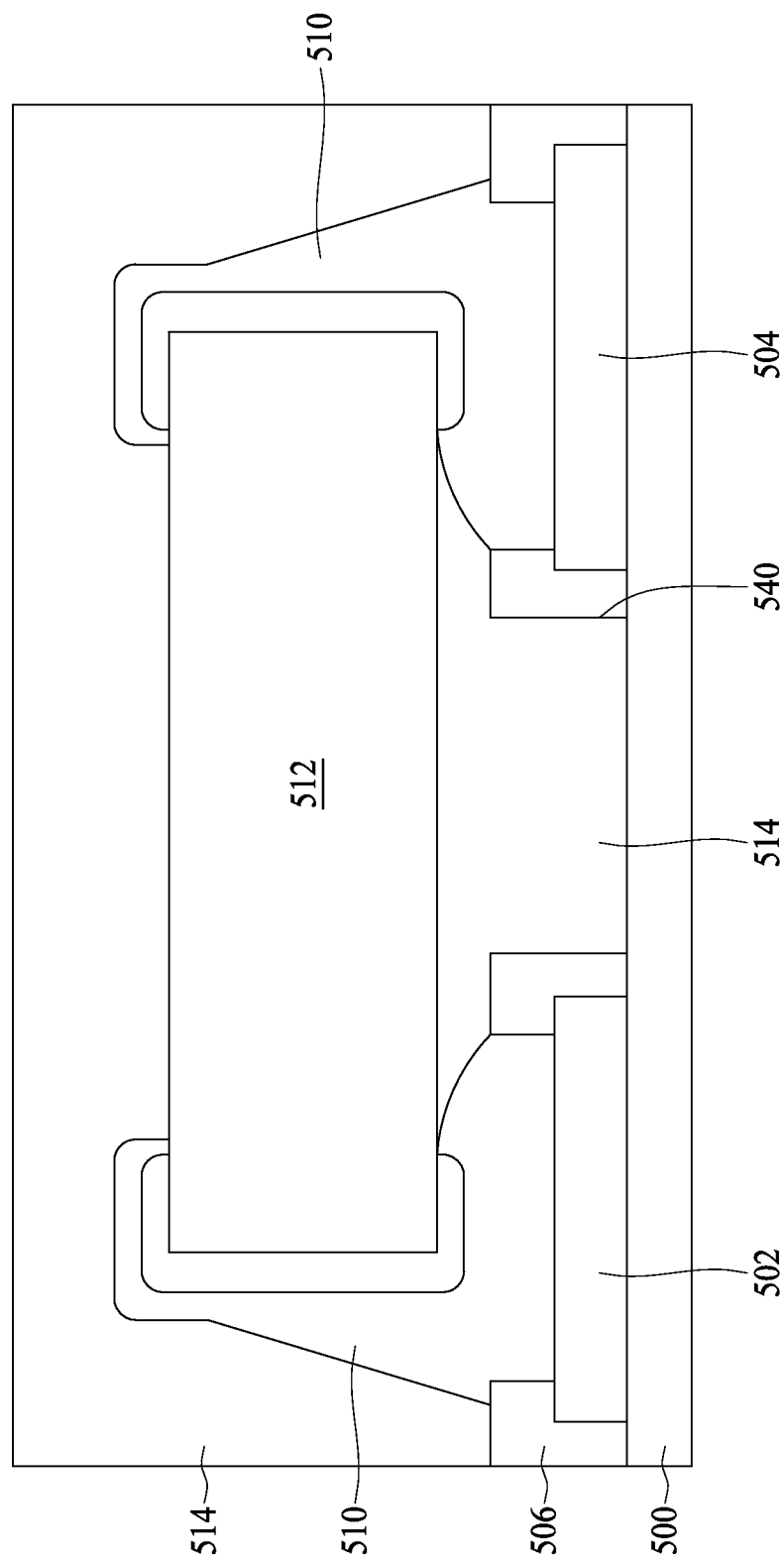
FIGS. 37, 38A, and 38B are cross sectional views of intermediate steps during processes for encapsulating a SMD/IPD in accordance with some embodiments.
Figure 38A:
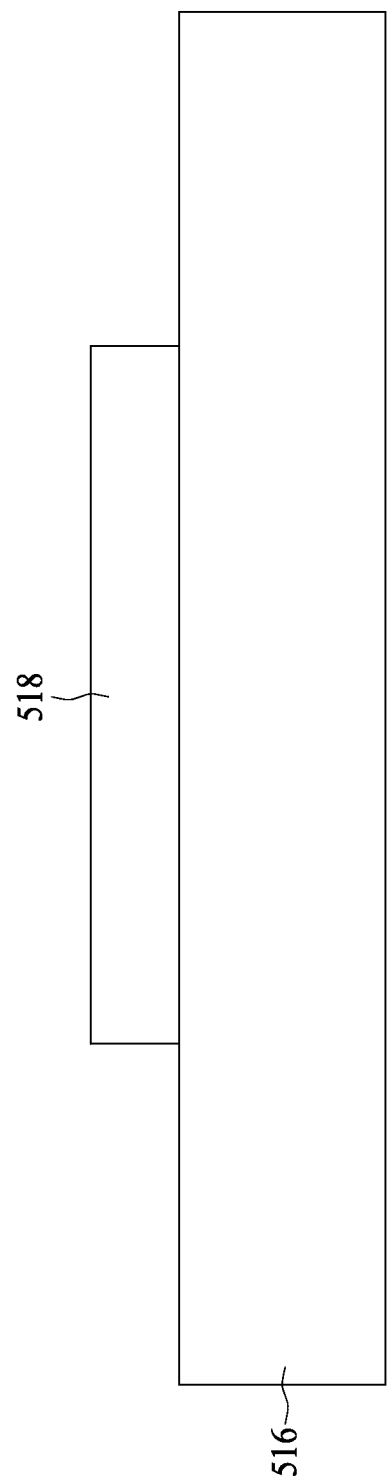
Figure 38B:
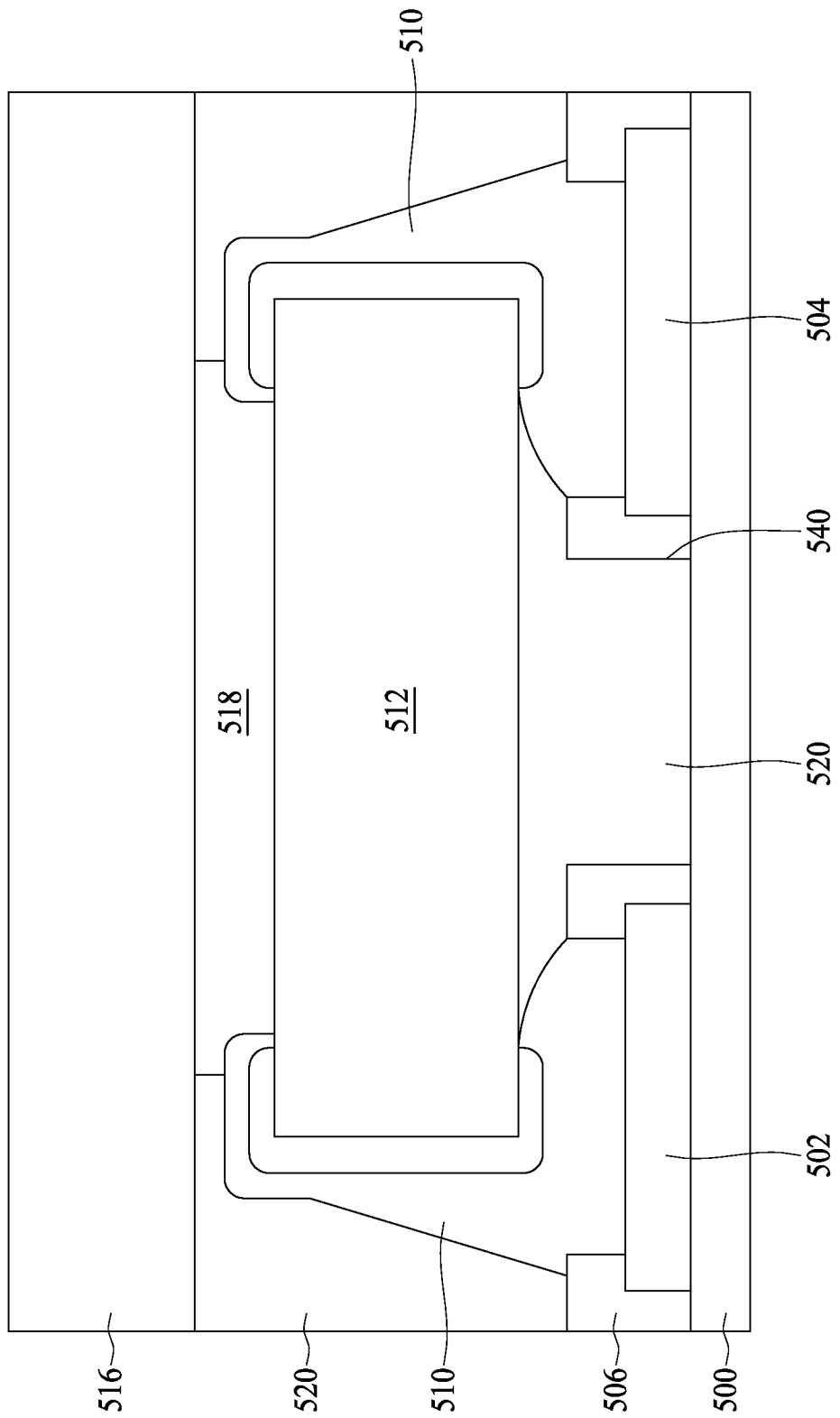

In some embodiments, as illustrated in FIG. 37, the SMD/IPD 512 is then encapsulated with an encapsulant 514 that can flow into the gap 540, which encapsulant may be an underfill material, a molding compound, or the like. In other embodiments, as illustrated in FIGS. 38A and 38B, another spacer material 518 can be formed on a substrate 516 that will oppose the SMD/IPD 512. In FIG. 38A, a spacer material 518, such as the spacer material 328 in FIG. 6, is formed on an area of the substrate 516, which may be by printing, jetting, or the like. In FIG. 38B, the substrate 516 is attached to the package on which the SMD/IPD 512 is attached, such as by reflowing external connectors (not illustrated). An underfill material 520 can then be dispensed and cured between the substrate 516 and the dielectric layer 506 and around the SMD/IPD 512. The underfill material 520 can flow into the gap 540.

The processes in FIGS. 36A through 36C, 37 and 38A through 38B may be applied to the SMD/IPDs 226, 260, and 282, similar to what was discussed above with respect to FIGS. 30A through 30D, 31 and 32A through 32B. One of ordinary skill in the art will readily understand that the respective dielectric layers 214, 251, and 204 can be patterned with the gap 540 during the patterning of those dielectric layers 214, 251, and 204 in FIGS. 13, 22, and 25, respectively. The encapsulant 514 can correspond to encapsulant 234 in FIG. 17, underfill material 408 in FIG. 27, or underfill material 412 in FIG. 29.

Embodiments may have advantages. Programming a circuit may be simplified and more reliable using an anti-fuse external to an integrated circuit die. In some previous applications, a fuse may have been in an integrated circuit die and may have been programmed using electrical burn out or laser cutting. In those applications, a thickness of a fuse portion of a fuse may be large causing electrical burn out or laser cutting to be difficult and causing the fuse to not be blown after such an electrical burn out or laser cutting. In some embodiments, an anti-fuse is placed in a package, external to an integrated circuit die, to program the circuit. This obviates any need to blow a fuse. Further, there may be increased flexibility in placement of an anti-fuse(s) in some embodiments.

Some embodiments may achieve other advantages. Mounting a SMD/IPD to a structure in some instances may cause a gap between the SMD/IPD and that structure. If, for example, an underfill material is formed around the SMD/IPD, the underfill material may not flow into the gap, and an air gap may be formed in the gap. During thermal cycling, expansion of the air may cause the structure to fail, much like the popping of a popcorn kernel. By having a spacer material between the SMD/IPD and the structure and/or by configuring a gap between the SMD/IPD and structure, an air gap may be reduced or avoided such that little or no air may be present during thermal cycling to cause a failure.

An embodiment is a package structure. The package structure includes an integrated circuit die, a redistribution structure, an anti-fuse, and external connectors. The integrated circuit die is embedded in an encapsulant. The redistribution structure is on the encapsulant and is electrically coupled to the integrated circuit die. The anti-fuse is external to the integrated circuit die and the redistribution structure. The anti-fuse is mechanically and electrically coupled to the redistribution structure. The external connectors are on the redistribution structure, and the redistribution structure is disposed between the external connectors and the encapsulant.

Another embodiment is a package structure. The package structure includes a die, an encapsulant, a redistribution structure, and an anti-fuse. The die comprises an integrated circuit, and die connectors are on an active side of the die and are electrically coupled to the integrated circuit. The encapsulant at least laterally encapsulates the die. The redistribution structure is on and adjoins the encapsulant. At least a portion of the redistribution structure is directly coupled to the die connectors. The anti-fuse is mechanically and electrically coupled to pads on an exterior side of the redistribution structure.

Another embodiment is a method. The method includes encapsulating an integrated circuit die in an encapsulant; forming a redistribution structure adjoining the encapsulant, the redistribution structure comprising pads; and mechanically attaching an anti-fuse to the pads.

A further embodiment is a structure. The structure includes a first package and a package component attached to the first package by external connectors. The first package comprises a device attached to a first pad and a second pad. The device is a surface mount device (SMD), an integrated passive device (IPD), or a combination thereof. The device is attached to the first pad and the second pad through a dielectric layer. A first spacer material is disposed laterally between the first pad and the second pad and is disposed between the device and the dielectric layer. An encapsulant surrounds the device and the spacer material.

A still further embodiment is a structure. The structure includes a first package. The first package includes an integrated circuit die at least laterally encapsulated with a first encapsulant, a redistribution structure on the integrated circuit die and the first encapsulant, and a device. The redistribution structure comprises a first pad, a second pad, and a dielectric layer. The device is attached through the dielectric layer to the first pad and the second pad. The device is a surface mount device (SMD), an integrated passive device (IPD), or a combination thereof. A recess is in the dielectric layer between the first pad and the second pad.

Another embodiment is a method. The method includes patterning openings through a dielectric layer to expose a first pad and a second pad. The dielectric layer is in a redistribution structure in a first package. The method also includes forming a first spacer material on the dielectric layer between the first pad and the second pad, and after forming the first spacer material, attaching a device to the first pad and the second pad. The device is a surface mount device (SMD), an integrated passive device (IPD), or a combination thereof. The first spacer material is disposed between the device and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a first package comprising a device attached to a first pad and a second pad, the device being a surface mount device (SMD), an integrated passive device (IPD), or a combination thereof, the device being attached to the first pad and the second pad through a dielectric layer, a first spacer material being disposed directly between the first pad and the second pad and disposed between the device and the dielectric layer, an encapsulant surrounding the device and the first spacer material, wherein a sidewall of the first spacer material facing the first pad is a point of the first spacer material that is located furthest from a center of the first spacer material in a cross-sectional view, wherein the first spacer material is separated from both the first pad and the second pad by the dielectric layer; and
a package component attached to the first package by external connectors.

2. The structure of claim 1, wherein the package component is a substrate, the external connectors being attached through the dielectric layer to respective under-metals, the encapsulant being an underfill material that further surrounds the external connectors.

3. The structure of claim 2 further comprising a second spacer material disposed between the device and the substrate, the encapsulant further surrounding the second spacer material.

4. The structure of claim 1, wherein the package component is a second package, the external connectors being attached through the dielectric layer to respective connector pads, the encapsulant being an underfill material that further surrounds the external connectors.

5. The structure of claim 4 further comprising a second spacer material disposed between the device and the second package, the encapsulant further surrounding the second spacer material.

6. The structure of claim 1, wherein the encapsulant further surrounds an integrated circuit die, the dielectric layer being in a redistribution structure, the redistribution structure being on the encapsulant and disposed between the encapsulant and the package component.

7. The structure of claim 1, wherein a composition of the encapsulant is different from a composition of the first spacer material.

8. The structure of claim 1, wherein the dielectric layer has a recess between the first pad and the second pad, the first spacer material being at least partially disposed in the recess.

9. The structure of claim 1, wherein no air gap is between the device and the dielectric layer.

10. A structure comprising:
a first package comprising:
an integrated circuit die at least laterally encapsulated with a first encapsulant, wherein the encapsulant comprises a first material throughout the encapsulant and the first material is planar with a connector connected to the integrated circuit die;
a redistribution structure on the integrated circuit die and the first encapsulant, the redistribution structure comprising a first pad, a second pad, and a dielectric layer; and
a device attached through the dielectric layer to the first pad and the second pad, the device being a surface mount device (SMD), an integrated passive device (IPD), or a combination thereof, a recess being in the dielectric layer between the first pad and the second pad, wherein the first pad and the second pad have a dimension in a plane parallel to a major surface of the dielectric layer and in a first direction perpendicular to a second direction, the second direction being from the first pad to the second pad, the recess having a length in the plane and in the first direction, the length being greater than the dimension.

11. The structure of claim 10, wherein a spacer material is disposed in the recess and between the dielectric layer and the device.

12. The structure of claim 10 further comprising a package component attached to the first package using external connectors, the external connectors being mechanically coupled through the dielectric layer to conductive features in the redistribution structure, an underfill material being disposed between the package component and the first package and around the device, the underfill material being disposed in the recess and between the dielectric layer and the device.

13. The structure of claim 10, wherein the encapsulant is disposed in the recess and between the dielectric layer and the device.

14. A structure comprising:
openings through a dielectric layer, wherein the openings expose a first pad and a second pad, the dielectric layer being in a redistribution structure in a first package;
a first spacer material on the dielectric layer between the first pad and the second pad, wherein the first spacer material does not extend beyond the first pad and the second pad in a first direction parallel with a top surface of the first pad, wherein the first spacer material is located within a recess, the recess being within the dielectric layer separate from the openings; and
a device attached to the first pad and the second pad, the device being a surface mount device (SMD), an integrated passive device (IPD), or a combination thereof, the first spacer material being disposed between the device and the dielectric layer.

15. The structure of claim 14, further comprising a recess within the dielectric layer between the first pad and the second pad, the first spacer material being disposed in the recess.

16. The structure of claim 14, further comprising:
a second spacer material on a package component; and
external connectors mechanically coupled through the dielectric layer to conductive features in the redistribution structure, the second spacer material being disposed between the device and the package component.

17. The structure of claim 14, further comprising:
external connectors connecting the first package to a substrate, the external connectors being mechanically coupled to the redistribution structure; and an underfill material between the first package and the substrate, the underfill material encapsulating the device and the external connectors.

18. The structure of claim 14, further comprising:

external connectors attaching the first package to a second package, the external connectors being mechanically coupled to the redistribution structure; and an underfill material between the first package and the second package, the underfill material encapsulating the device and the external connectors.

19. The structure of claim 14, further comprising:

an integrated circuit die adhered to the redistribution structure; and an encapsulant encapsulating the device and the integrated circuit die.

* * * * *